(12) United States Patent
Tomita et al.

(10) Patent No.: US 8,405,374 B2
(45) Date of Patent: Mar. 26, 2013

(54) POWER AMPLIFICATION DEVICE

(75) Inventors: Naotaka Tomita, Kawasaki (JP); Tooru Kijima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 331 days.

(21) Appl. No.: 12/849,379

(22) Filed: Aug. 3, 2010

(65) Prior Publication Data

US 2011/0089921 A1 Apr. 21, 2011

(30) Foreign Application Priority Data

Oct. 19, 2009 (JP) ................................. 2009-240605

(51) Int. Cl.
G05F 1/575 (2006.01)
G05F 1/613 (2006.01)

(52) U.S. Cl. ........ 323/284; 323/222; 323/283; 323/285; 330/279; 330/291

(58) Field of Classification Search .................. 323/222, 323/223, 282, 283, 284, 285; 330/127, 180, 330/207 A, 250, 251, 277, 278, 279, 291, 330/297, 9, 10, 157; 327/557

See application file for complete search history.

(56) References Cited

U.S. PATENT DOCUMENTS

| | | | | |
|---|---|---|---|---|
| 4,504,793 A * | 3/1985 | Yokoyama | ...................... | 330/10 |
| 4,607,323 A * | 8/1986 | Sokal et al. | ...................... | 363/97 |
| 7,023,267 B2 | 4/2006 | Lee et al. | | |
| 7,319,763 B2 * | 1/2008 | Bank et al. | ...................... | 381/77 |
| 7,352,237 B2 | 4/2008 | Snelgrove et al. | | |
| 7,474,149 B2 | 1/2009 | Snelgrove et al. | | |
| 7,729,670 B2 * | 6/2010 | Rofougaran | ............... | 455/127.1 |
| 2009/0027119 A1 | 1/2009 | Williams et al. | | |

FOREIGN PATENT DOCUMENTS

| | | |
|---|---|---|
| JP | 2001-156554 | 6/2001 |
| JP | 2002-539659 | 11/2002 |
| JP | 2006-528457 | 12/2006 |
| JP | 2007-519340 | 7/2007 |

OTHER PUBLICATIONS

Johnson et al., "Asynchronous Modulator for Linearization and Switch-mode RF Power Amplifier Applications," 2009 IEEE Radio Frequency Integrated Circuits Symposium (2009), pp. 185-188.
Notice of Reasons for Rejection for Application No. 2009-240605, from the Japanese Patent Office, mailed Aug. 23, 2011.

* cited by examiner

*Primary Examiner* — Gary L Laxton
(74) *Attorney, Agent, or Firm* — Finnegan, Henderson, Farabow, Garrett & Dunner, L.L.P.

(57) ABSTRACT

A power amplification device configured to switching-amplify a high-frequency input signal and output a switching-amplified signal. The device includes a feedback circuit configured to output a feedback signal including a portion of the switching-amplified signal; a subtractor configured to output an error signal indicating a difference between the input signal and the feedback signal; a comparator configured to compare the error signal with a threshold voltage and generate an on/off pulse signal based on a result of the comparison; a one-shot circuit configured to be set in an on-state for a time period using a rising timing of the pulse signal as a trigger; and an amplifier configured to switching-amplify the input signal by a logical OR between the generated on/off pulse signal and an output signal from the one-shot circuit, and output the switching-amplified signal.

13 Claims, 26 Drawing Sheets

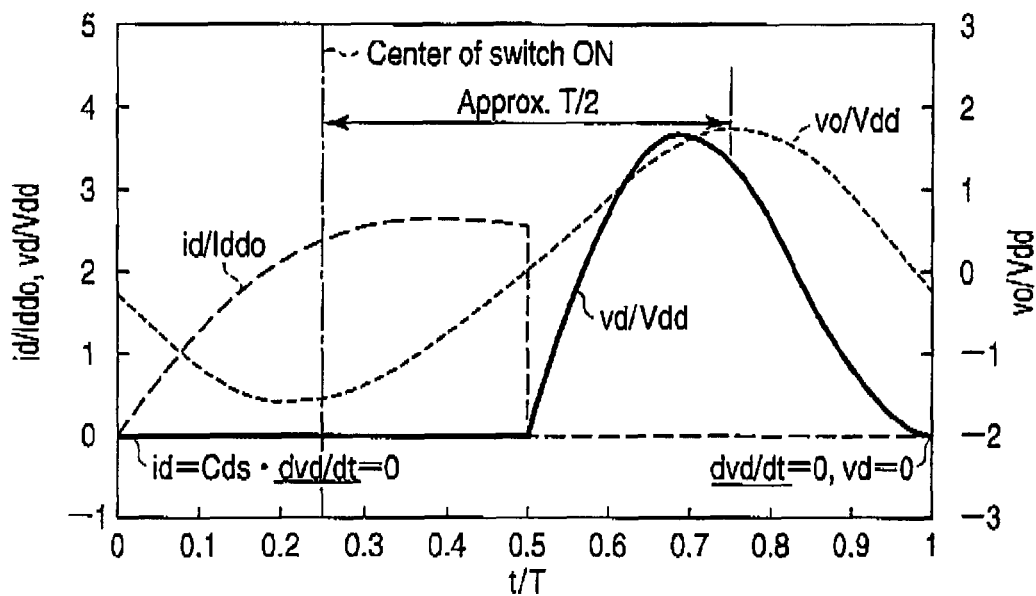
F I G. 7
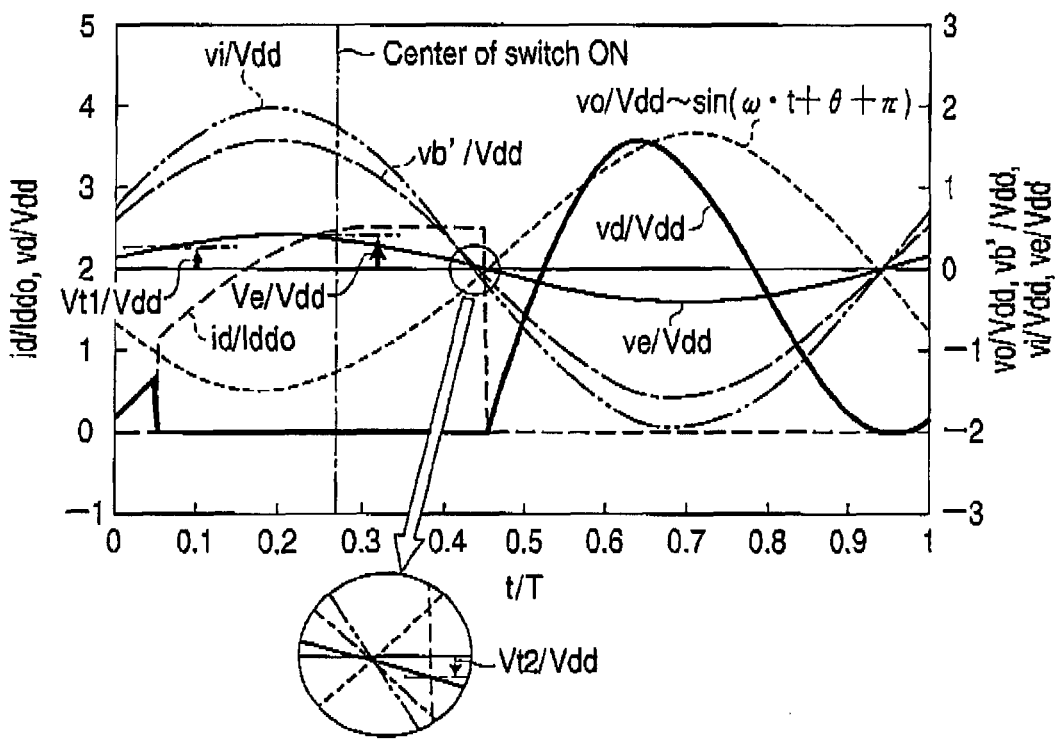
F I G. 8

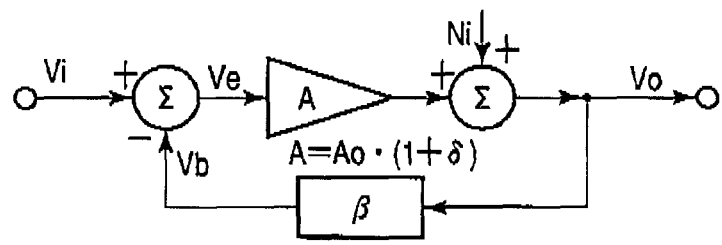
F I G. 22
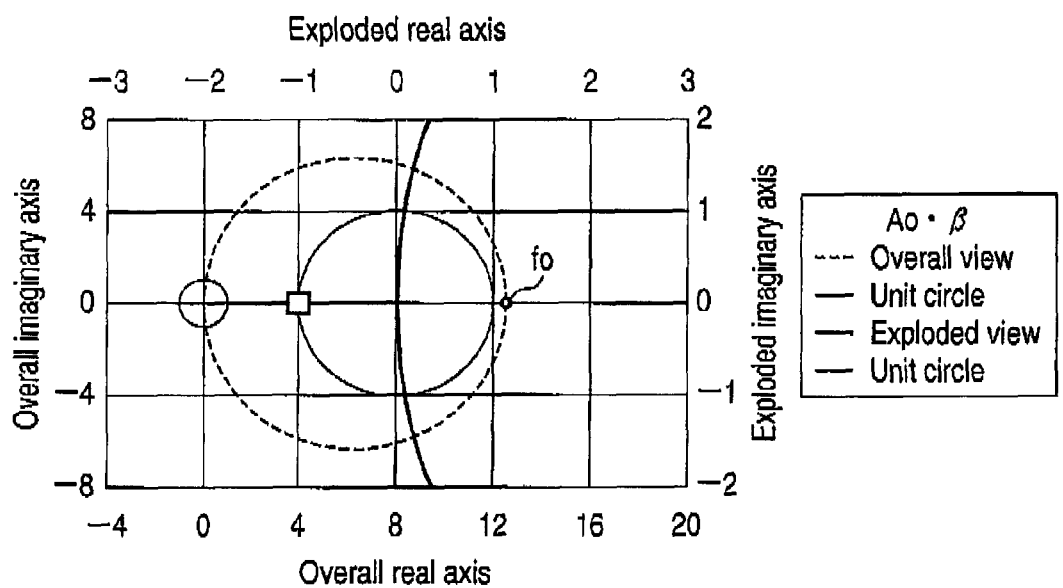
F I G. 23

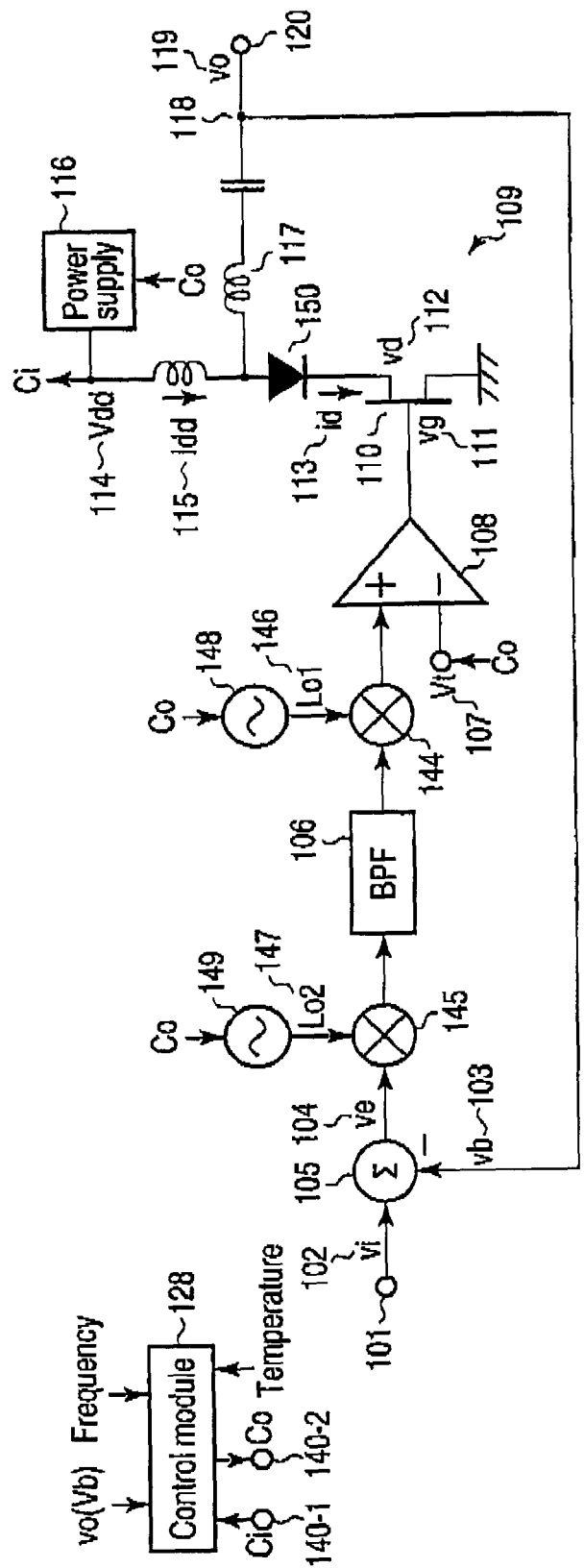
F I G. 30

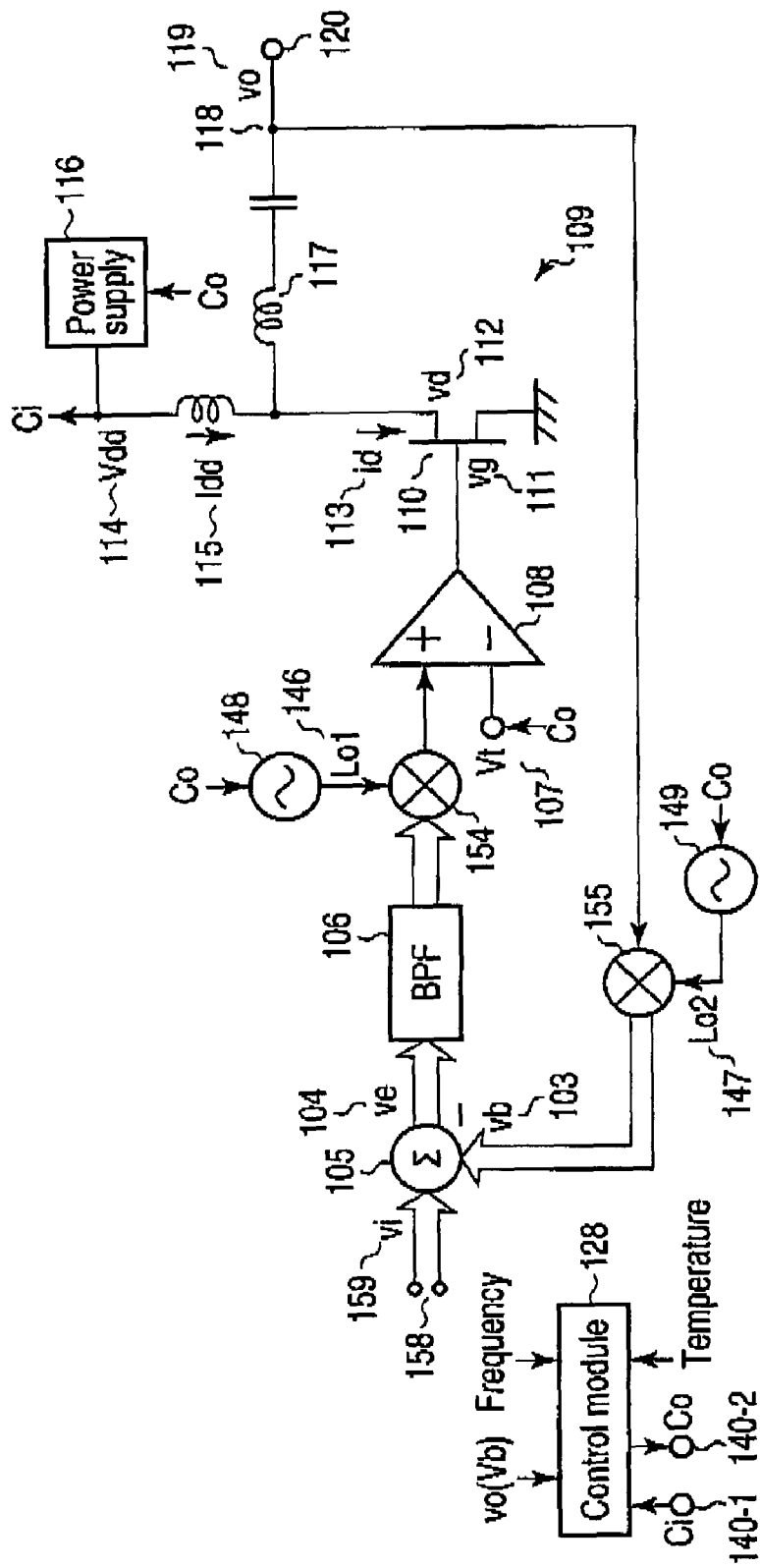
F I G. 34

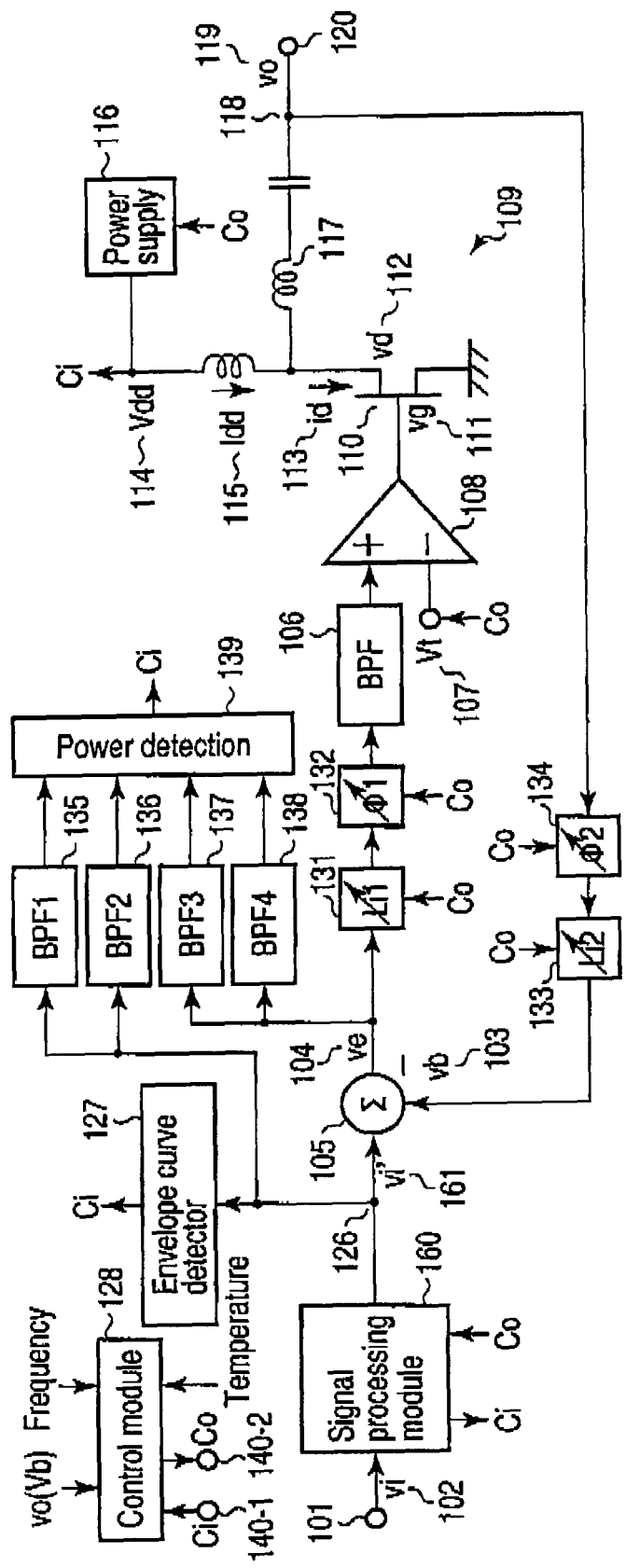
F I G. 35

POWER AMPLIFICATION DEVICE

CROSS-REFERENCE TO RELATED APPLICATIONS

This application is based upon and claims the benefit of priority from Japanese Patent Application No. 2009-240605, filed Oct. 19, 2009; the entire contents of which are incorporated herein by reference.

FIELD

Embodiments described herein relate generally to a power amplification device.

BACKGROUND

Power amplification devices configured to amplify high-frequency signals have two conflicting requirements, i.e., high efficiency and low distortion. Switching amplifiers, such as class D, E and F amplifiers, in theory have 100% efficiency. However, in order to superimpose amplified information on output signals, the power supply voltage needs to be varied by modulating the voltage, or the on/off timing or ratio of switching needs to be varied.

Recently, various approaches have been proposed that attempt to have both high efficiency and low distortion at high frequencies, and a promising approach is to keep the power supply voltage of a switching amplifier constant. For example, the approach of U.S. Pat. No. 7,352,237 (Reference 1) compensates for distortion of a high-frequency and high-efficiency class E or F switching amplifier with a negative feedback, and generates a pulse input signal of the switching amplifier in a sequencer configured to turn off the pulse input when the voltage of a high-frequency error signal turns positive from negative, and return the pulse input signal to an on-state after a predetermined period of time has elapsed. However, this approach poses a problem that efficiency is severely degraded at high frequencies, since the on/off timing and ratio in a backoff state greatly deviates from those at the maximum output power optimized for the output tuning circuit and generate a large amount of out-of-band noise.

In order to solve this problem, the approach of U.S. Pat. No. 7,474,149 (Reference 2) varies the power voltage of a switching amplifier according to the envelope curve of a high-frequency input signal. This approach generates less out-of-band noise and provides a higher efficiency switching amplifier than Reference 1, since the on/off timing and ratio approximate those of the state in which the output tuning circuit is optimized.

The approaches of References 1 and 2, however, pose a problem that synchronization cannot be established with the resonance phenomenon of an output tuning circuit of a switching amplifier. This degrades efficiency at high frequencies and quantized noise remains as out-of-band noise. Accordingly, a band pass filter needs to be provided on a high-power output side so as to prevent out-of-band noise components.

BRIEF DESCRIPTION OF THE DRAWINGS

FIG. 7 illustrates an example (fo, DF=50%) of a waveform of a class E amplifier;

FIG. 8 illustrates another example (fo, DF=40%) of a waveform of a class E amplifier;

FIG. 22 illustrates a configuration example of a negative feedback circuit;

FIG. 23 illustrates an example (fo, Ao·β=22 dB, τg/T=0) of a Nyquist diagram;

FIG. 26 illustrates another example (fo, Ao·β=22 dB, τg/T=3) of a closed loop gain, a distortion improved amount, and the like;

FIG. 30 is a circuit configuration diagram illustrating a power amplifier according to a fourth embodiment;

FIG. 34 is a circuit configuration diagram illustrating a power amplifier according to a seventh embodiment;

FIG. 35 is a circuit configuration diagram illustrating an eighth embodiment of a power amplifier;

DETAILED DESCRIPTION

Figure 1:
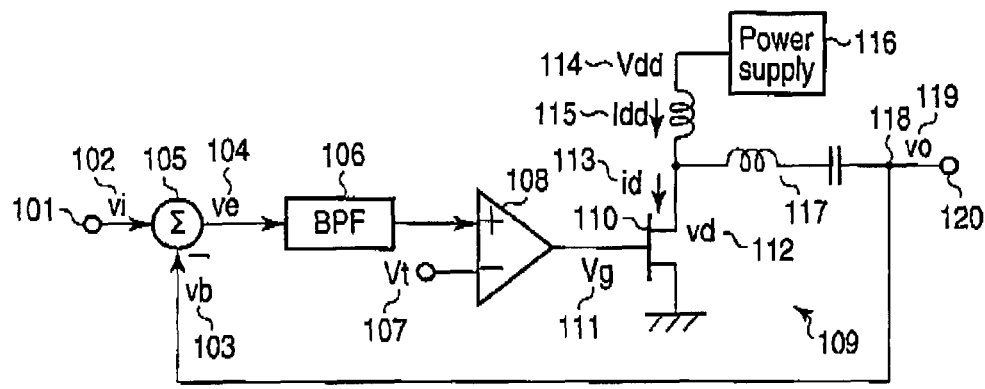
FIG. 1 is a circuit configuration diagram illustrating a first embodiment of a power amplifier.

In general, according to one embodiment, a power amplification device configured to switching-amplify a high-frequency input signal into an output signal includes a feedback circuit, a subtractor, a comparator, an output tuning circuit, a constant voltage controlled power supply, and an amplifier. The feedback circuit is configured to output a portion of the output signal as a feedback signal. The subtractor is configured to output a difference between the input signal and the feedback signal as a error signal. The comparator is configured to generate an on/off pulse signal by comparing the error signal with a predetermined threshold voltage. The output tuning circuit is configured to resonate to a frequency of the input signal. The amplifier is configured to generate the output signal by switching-amplifying the input signal according to the on/off pulse signal, and output the output signal to the output tuning circuit.

Hereinafter, embodiments will be described in detail with reference to the accompanying drawings. In the drawings, the same reference numerals denote the same portions or corresponding portions.

First Embodiment

FIG. 1 is a circuit configuration diagram illustrating a first embodiment of a power amplifier. The power amplifier comprises a high-frequency input terminal 101, a subtractor 105, a negative feedback bandpass filter 106, a comparator 108, a switching amplifier 109, a first coupler 118, and a high-frequency output terminal 120. The switching amplifier 109 comprises a switching element 110 and an output-side tuning circuit 117 configured to resonate to the switching element 110 and a high-frequency signal input to the power amplifier, and performs switching amplification using a power supply voltage supplied from the power supply 116. FIG. 1 illustrates a circuit configuration using a class E amplifier, in which the switching element 110 is a GaN high electron mobility transistor (HEMT).

A high-frequency input signal (vi) 102 is input to the high-frequency input terminal 101, the subtractor 105 subtracts the high-frequency feedback signal (vb) 103 in a phase relation in which the high-frequency input signal 102 becomes small. After a high-frequency error signal (ve) 104, which is an output thereof, passes through the negative feedback bandpass filter 106, the high-frequency error signal (ve) 104 is input to the comparator 108. The threshold (Vt) 107 of the comparator 108 is set such that the comparator 108 outputs a pulse that turns on from off the output of the comparator as a first threshold voltage (Vt1) at the time of crossing of the input voltage from low to high when the output of the comparator is in an off-state, and turns off from on the output of the comparator as a second threshold voltage (Vt2) at the time of crossing of the input voltage from high to low when the output of the comparator is in an on-state.

The pulse signal is used as a gate voltage (vg) 111 of the switching element 110, and the drain voltage (vd) 112, the drain current (id) 113, and the power source current (Idd) 115 drive the switching amplifier 109, which is determined by the voltage (Vdd) 114 and the output-side tuning circuit 117. A high-frequency output signal (vo) 119 output from the switching amplifier 109 is output from the high-frequency output terminal 120, and a corresponding high-frequency feedback signal 103 is output from the first coupler 118.

The first and second threshold voltages (Vt1), (Vt2) are supplied from a reference voltage circuit (not shown) set by a design value (fixed value) that takes characteristics of the switching element 110 into consideration, such as input bias characteristics and output linearity. Further, as will be described below, the reference value may be supplied from a reference voltage circuit (not shown) that outputs a reference voltage obtained by correcting various types of monitor data of the power amplifier.

Further, the comparator may be a simple comparator that sets the threshold voltages in the same way as a hysteresis comparator that sets the threshold voltages such that first threshold voltage (Vt1)>second threshold voltage (Vt2). Further, the threshold voltages may be set such that first threshold voltage (Vt1)<second threshold voltage (Vt2). Setting of the comparator is arbitrarily selected according to the object and characteristics of the power amplifier.

Figure 2A:
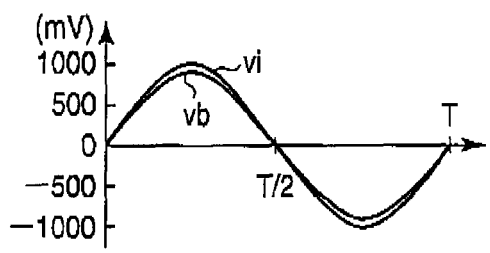
FIGS. 2A and 2B illustrate waveforms of signals according to the first embodiment.
Figure 2B:
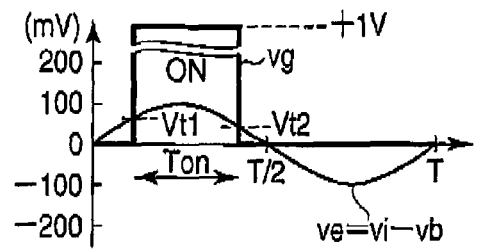

FIGS. 2A and 2B illustrate waveforms of signals according to the first embodiment. FIG. 2A illustrate a high-frequency input signal vi and a high-frequency feedback signal vb input to the subtractor 105. FIG. 2B illustrates an error signal ve output from the subtractor 105, the first threshold voltage Vt1 and the second threshold voltage Vt2 of the comparator 108, and the gate voltage vg output from the comparator 108. It is to be noted that a cycle of a frequency f of a high-frequency input signal will be referred to as T=1/f, and the period of time during which the comparator is turned on will be referred to as Ton. Further, since the first coupler 118 of FIG. 1 is provided outside the output-side tuning circuit 117 of the class E amplifier, the high-frequency feedback signal (vb) 103 includes almost no harmonic components.

Figure 3A:
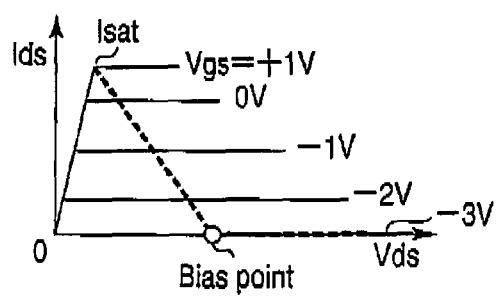
FIGS. 3A and 3B illustrate a general class C operation.
Figure 3B:
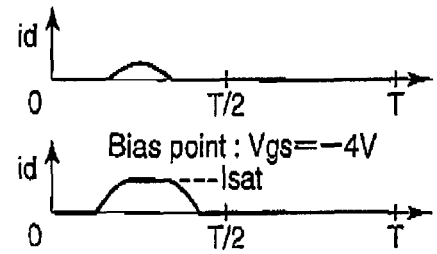

A non-hysteresis pulse waveform of the case where the relation Vt1=Vt2 is satisfied corresponds to the current waveform of a high-gain class C operation. This will be described in detail with reference to FIGS. 3A, 3B, 4A, and 4B. FIGS. 3A and 3B illustrate an example of a general class C operation. An amplification element is set such that dependency of a drain current Ids on a gate voltage Vgs with respect to a source-grounded drain voltage Vds follows a pentode characteristic, and the waveform has a cutoff at Vgs=−3 V, becomes linear at Vgs=−2 to 0 V, and reaches a saturated current (Isat) at Vgs=+1 V. When its bias point is −4 V, the current does not flow until the high-frequency input voltage reaches 1 Vpeak (=−3 V−(−4 V)), keeps a waveform that has clipped a portion of a substantially sinusoidal wave until the high-frequency input voltage reaches 5 Vpeak (=+1 V−(−4 V)), and becomes flat at a saturated current Isat in a time domain in which the high-frequency input voltage exceeds 5 Vpeak.

Figure 4A:
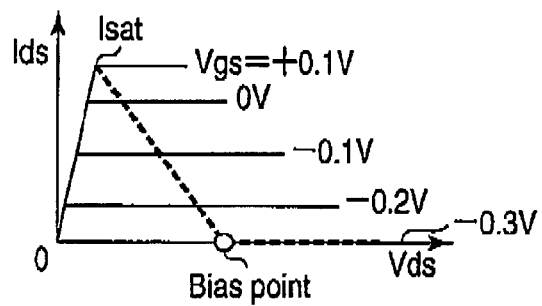
FIGS. 4A and 4B illustrate a high-gain class C operation.
Figure 4B:
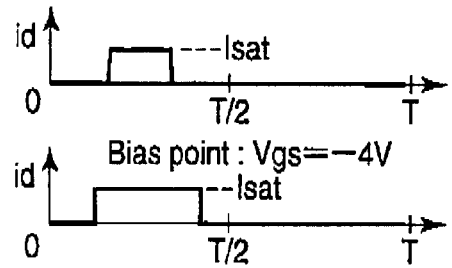

FIGS. 4A and 4B illustrate the case of a high-gain class C operation, where an amplification element has a cutoff at Vgs=−0.3 V, becomes linear at Vgs=−0.2 to 0 V, and reaches Isat at Vgs=+0.1 V. When its bias point is −4 V, a current does not flow until the high-frequency input voltage reaches 3.7 Vpeak (=−0.3 V−(−4 V), has a waveform that has clipped a portion of a substantially sinusoidal wave until the high-frequency input voltage reaches 4.1 Vpeak (=+0.1 V−(−4 V)), and becomes flat at Isat in a time domain in which the high-frequency input voltage exceeds 4.1 Vpeak. That is, since the domain in which the waveform has clipped a portion of a substantially sinusoidal wave is small, the waveform approximates the square waves as shown in FIGS. 2A and 2B.

Figure 5:
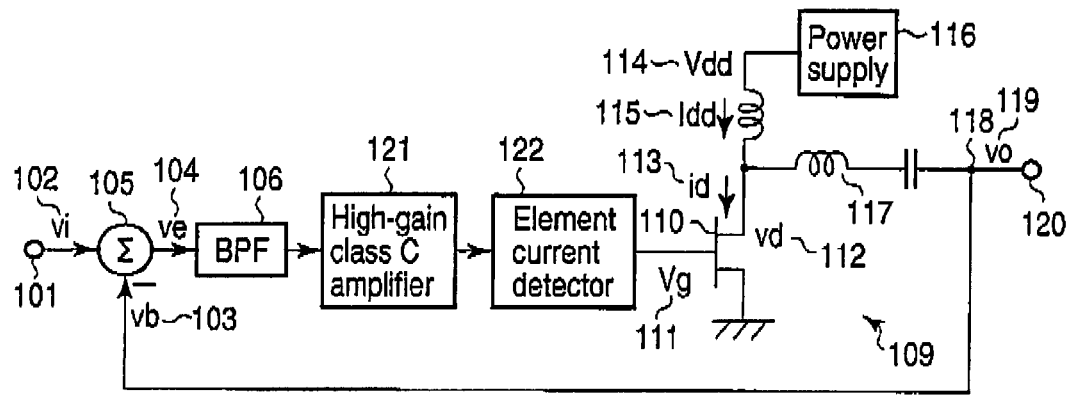
FIG. 5 schematically illustrates a circuit configuration of the first embodiment.

It can be understood from the above that the power amplifier of FIG. 1 is an analogue negative feedback amplifier that makes the last-stage element 110 of the analogue negative feedback amplifier shown in FIG. 5 a high-efficiency switching amplifier, and replaces the high-gain class C amplifier 121 and its element current detector 122 for driving the switching amplifier with the comparator 108.

Thus, in the first embodiment in which switching is driven in accordance with ON/OFF of a pulse output from the comparator, the ON/OFF timing and ratio of the switching are not quantized and synchronization is established with the tuned output from the output-side tuning circuit 117 almost without an error. Therefore, efficiency is not much degraded even at high frequencies. As a result, out-of-band noise can be greatly reduced, and the specification of the bandpass filter for preventing bulk-power output-side out-of-band noise components can be greatly reduced or eliminated.

The gate voltage vg in FIG. 2B varies from 0 to +1 V, as described above. However, when GaN HEMT has a cutoff at Vgs=−3 V and becomes a saturated current Isat at Vgs=−+1 V, for example, a pulse amplifier is required so as to adjust the pulse voltage input to the switching element 110. Such a pulse amplifier is not shown in FIG. 1 for ease of explanation.

Figure 6:
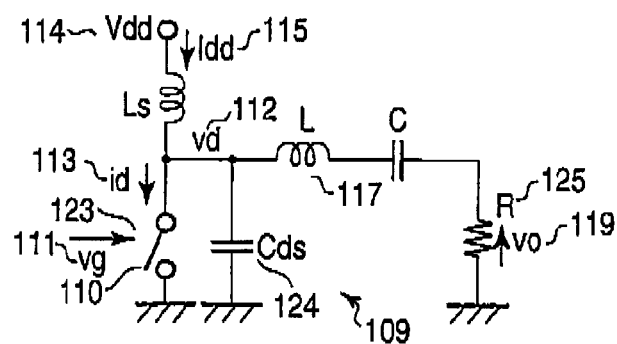
FIG. 6 illustrates an exemplary equivalent circuit of a class E amplifier.

An operation of a class E amplifier will be described below, with reference to the equivalent circuit shown in FIG. 6. For the sake of simplicity, FIG. 6 shows only an ideal switch 123 and a drain-source capacitance (Cds) 124 on the output side of the switching element 110, and Cds, Ls, L, and C other than a load resistance (R) 125 form the output-side tuning circuit 117. An angular frequency of a frequency f is set to $\omega=2\cdot\pi\cdot f$, and a duty factor is set to DF=Ton/T. In a circuit constant satisfying the conditions of a class E operation at the central frequency fo, Vdd, DF=50%, i.e., a circuit constant satisfying (1) vd=0 (no loss is caused by dissipation of Cds) and (2) dvd/dt=0 (the actual switching element takes a transient resistance at the time of switching, but little loss is caused immediately after the switch is turned on, when id=Cds·dvd/dt=0) immediately before the switch is turned on from off, R=1.3·Vdd/Iddo, Cds=0.69/($\omega$o·R), C=0.24/($\omega$o·R), Ls=0.86·R/$\omega$o, where Q=$\omega$o·L/R=4.4, for example, and Iddo indicates a power source current at that time. For example, when DF=50%, fo=2 GHz, Vdd=50 V, and Iddo=6 A, R=11Ω, Cds=5.0 pF, C=−1.7 pF, Ls=0.75 nH, and L=3.8 nH. Since there is no loss in this case, a high-frequency output power remains the same as the consumption power Vdd·Iddo=1.3·Vdd2/R. Since the load impedance, which is determined by Cds and the like, does not vary according to variation in power supply voltage in the simplified model of FIG. 6, there will be no loss when DF=50% even if the power source voltage becomes Vdd', and the high-frequency output power becomes 1.3·Vdd'2/R.

FIG. 7 shows a waveform of a class E amplifier when DF=50%. As shown in FIG. 7, the drain voltage vd satisfies the above-described conditions (1) and (2), and the output signal vo includes almost no harmonic components (second harmonic wave/power consumption is less than or equal to 1% in FIG. 7). Further, since vo becomes maximum after approximately T/2 from the center of switch ON, the input vg and the output vo are in an approximately reversed phase. Accordingly, when a group delay time other than the switching amplifier 109 and the negative feedback bandpass filter 106 is zero, an approximately negative feedback is obtained by replacing the subtractor 105 with an adder.

Next, a waveform of a class E amplifier when DF=40% is shown in FIG. 8. Since vd immediately before the switch is turned on from off when t/T=0.05 is not zero, loss is generated by discharge of Cds. Further, since dvd/dt, i.e., id immediately after the switch is turned on is not zero, loss is further increased by a transient resistance at the time of switching. Assuming that the fundamental wave components of the output signal vo are in proportion to $\sin(\omega\cdot t+\theta+\pi)$, the phase shift $\theta$ is defined as $\theta=22$ degrees. Since $\theta=6$ degrees when DF=50% as in FIG. 7, dependence of the phase shift on DF, i.e., phase distortion occurs. In order to stabilize a negative feedback that compensates for the negative feedback, distortion needs to be suppressed. Assuming that the amplitude of the feedback signal vb is the same as that of the output signal vo, when the fundamental wave component bv', the input signal vi, and the error signal ve=vi−vb' are layered as in FIG. 8, the distortion can be compensated by setting ve of t/T=0.05 when the switch is turned on from off to the first threshold voltage Vt1, and ve of t/T=0.45, when the switch is turned off from on to the second threshold voltage Vt2. Hereinafter, a concrete method for compensating for the distortion of an actual class E amplifier will be described with reference to the distortion of the simplified model in FIG. 6.

Figure 9:
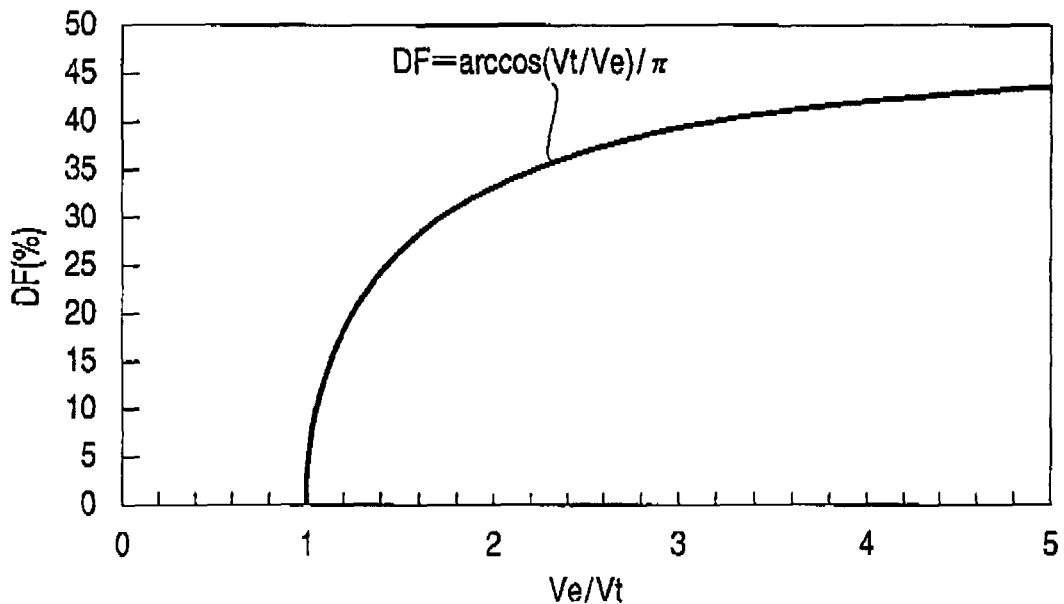
FIG. 9 illustrates an example of a DF with respect to Ve/Vt.

First, the amplitude distortion (AM-AM) of class E amplifier will be described. For example, when the first and second threshold voltages are same, i.e., Vt1=Vt2=Vt, DF(%) with respect to the ratio Ve/Vt of the amplitude Ve (Vpeak) of the fundamental wave component of a high-frequency error signal ve to the threshold voltage Vt (V) is obtained from the relation Vt=Ve·cos($\pi$·DF), as shown in FIG. 9. As a matter of course, Ve can be converted into DF only in the domain where Ve/Vt≧1 is satisfied. Further, DF differentiated with respect to Ve/Vt is always positive, and its differential coefficient decreases as Ve/Vt increases (the second order differential is negative).

Figure 10:
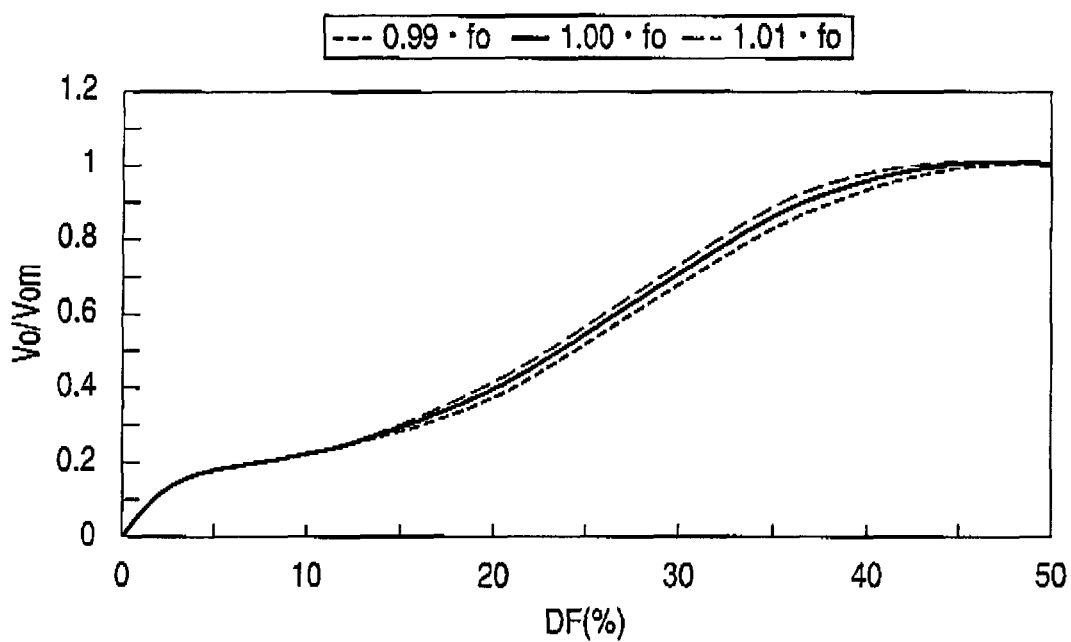
FIG. 10 illustrates an example of Vo/Vom with respect to DF.

The ratio Vo/Vom of Vo (Vpeak) to the amplitude Vom (Vpeak) of the fundamental wave component of the output signal of DF=50% is shown in FIG. 10. In FIG. 10 with varying DFs, the output waveform is calculated by 0.99·fo, 1.00·fo, 1.01·fo, and the amplitude and phase of the fundamental wave components are calculated by a fast Fourier transform (FFT), as in the case of FIGS. 7 and 8. Vo/Vom differentiated with respect to DF is positive, except for the case where DF=45% to 50% at 1.01·fo. Although the domain where DF=45% to 50% at 1.01·fo, where the differential coefficient is negative, is not suitable for a negative feedback, Vo/Vom of DF=45% is 0.98 (0.2 dB backoff) even at 0.99·fo, which is the lowest in FIG. 10, and is permissible even by setting the upper limit of DF to 45%. Further, the differential coefficient increases in the domain where Vo/Vom=0.2 to 0.7 (DE=10 to 30%) (the second order differential is positive), but decreases in the other domains (the second order differential is negative).

Figure 11:
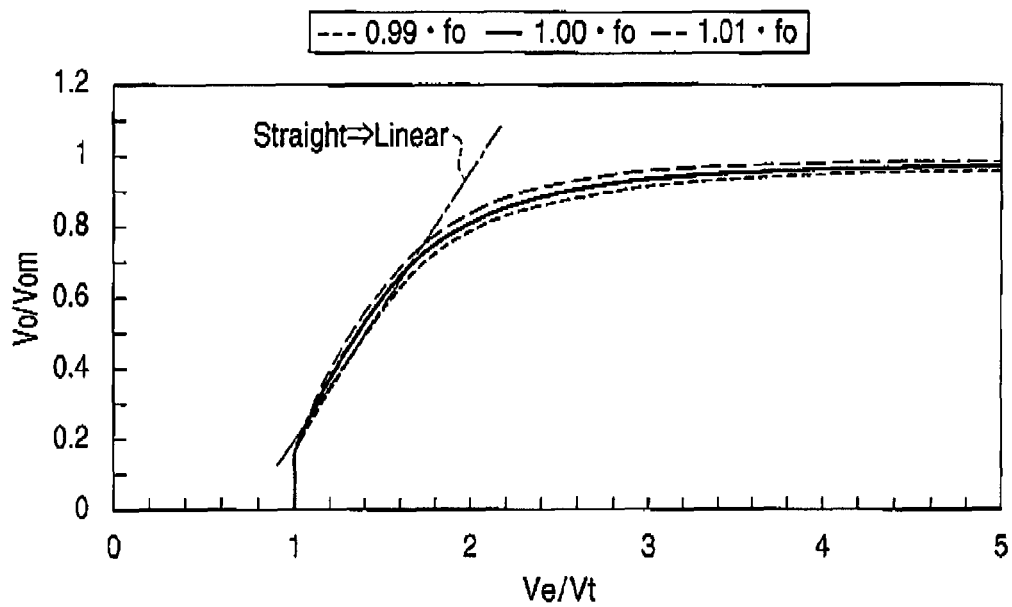
FIG. 11 illustrates an example of Vo/Vom with respect to Ve/Vt.

FIG. 11 shows amplitude characteristics from the input of the comparator input to output of the switching amplifier, obtained by using FIGS. 9 and 10. When Vo/Vom=0.2 to 0.7 (14 to 3 dB backoff), the curved portion of FIG. 9 and the curved portion of FIG. 10 are canceled and the waveform is approximately linear, i.e., is approximately linear with respect to minor change. Accordingly, the amplitude becomes approximately linear throughout the dynamic range 11 dB by setting the threshold voltage Vt such that DF=approximately 10% when 14 dB backoff is made from the maximum output power of DF=50%. When Vo/Vom is greater than or equal to 0.7, however, the gain decreases and the distortion improvement by the negative feedback is reduced. When Vo/Vom is less than or equal to 0.2, however, the gain increases and the negative feedback becomes unstable. An approximate formula indicating the relation between Vom and Vdd when DF=50% will be described. When approximation is attained when the consumed power is equal to the power of the fundamental wave, $Vdd \cdot Iddo = 1.3 \cdot Vdd^2/R = Vom^2/(2 \cdot R)$, and $Vdd = 0.61 \cdot Vom$.

Figure 12:
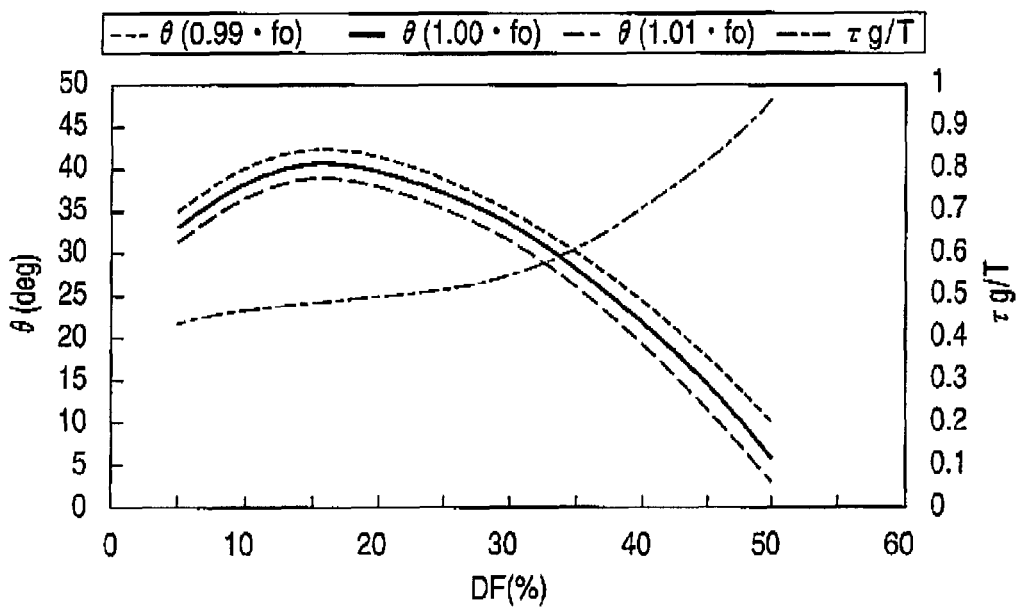
FIG. 12 illustrates an example of θ, τg/T with respect to DF.
Figure 13:
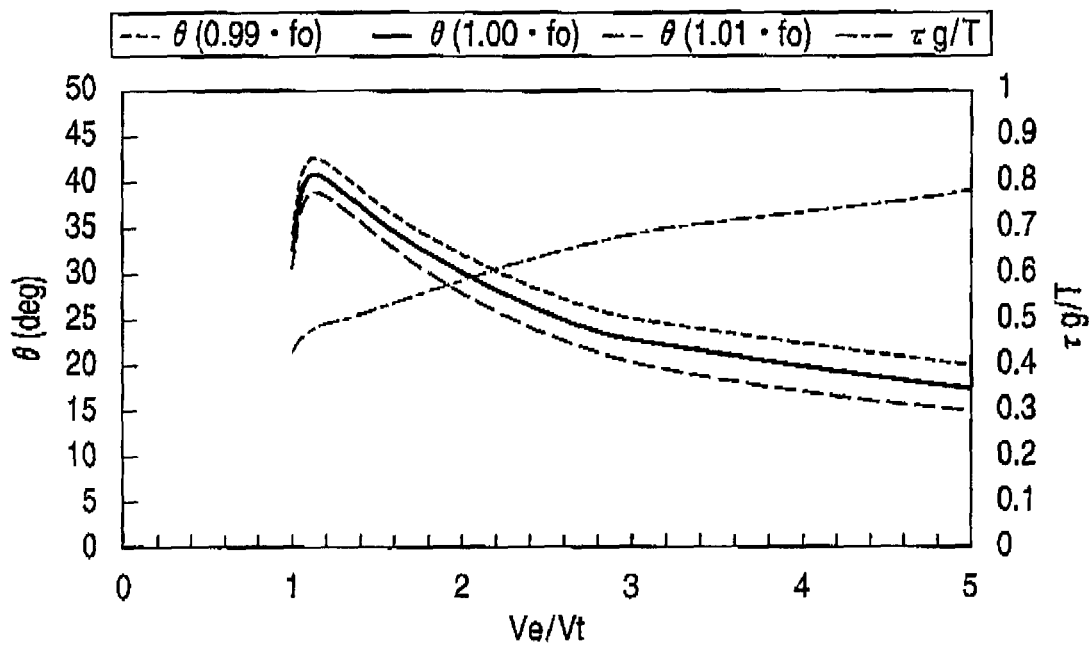
FIG. 13 illustrates an example of θ, τg/T with respect to Ve/Vt.
Figure 14:
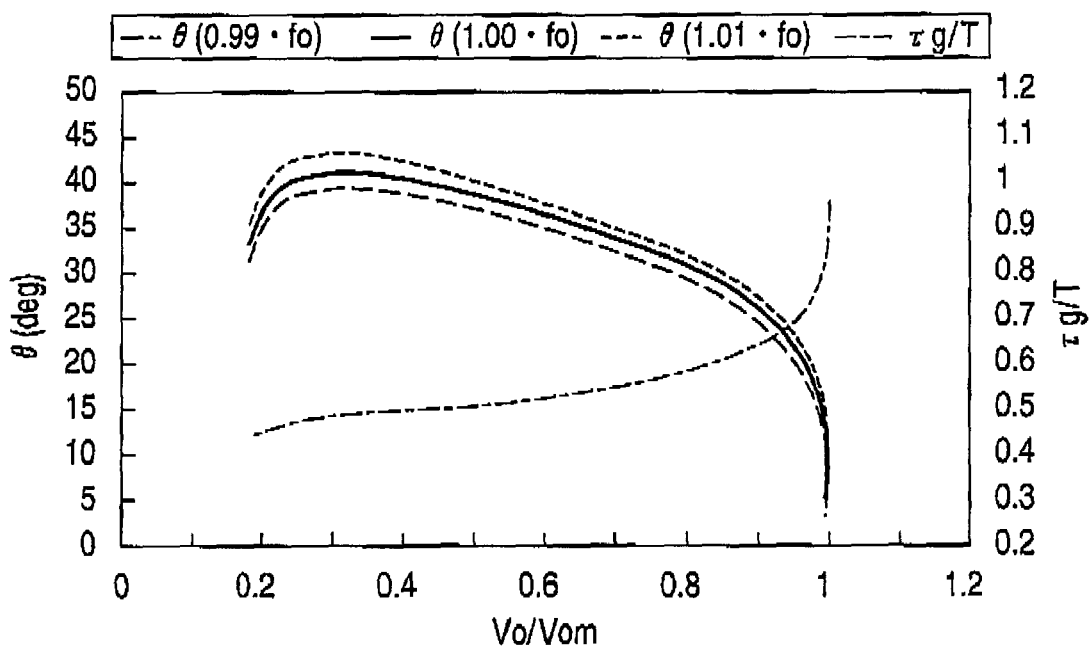
FIG. 14 illustrates an example of θ, τg/T with respect to Vo/Vom.

Next, the phase distortion (AM-PM) of a class E amplifier will be described. Phase characteristics, in which the phase e defined in FIG. 8 varies at DF are shown in FIG. 12. When DF increases from 5%, θ increases and reaches the maximum approximately 40 degrees at DF=approximately 15%, and decreases at greater degrees of DF. Further, variation of θ with respect to the input amplitude Ve/Vt is shown in FIG. 13. When Ve/Vt becomes greater than 1, θ increases and reaches the maximum of approximately 40 degrees at approximately 1.1, and decreases when Ve/Vt becomes greater. Lastly, θ with respect to the output amplitude Vo/Vom is shown in FIG. 14. When Vo/Vom is approximately 0.3, θ reaches the maximum approximately 40 degrees, and when Vo/Vom is greater than or equal to approximately 0.9, θ rapidly becomes small, and when Vo/Vom=1 at fo, θ becomes approximately 6 degrees. It is to be noted that the group delay time $\tau g = d\theta/d\omega$ is large, due to the output-side tuning circuit 117, unlike digital amplifiers. The value of τg increases as the amplitude increases, and becomes approximately τg=T when Vo/Vom=1.

Second Embodiment

Figure 15:
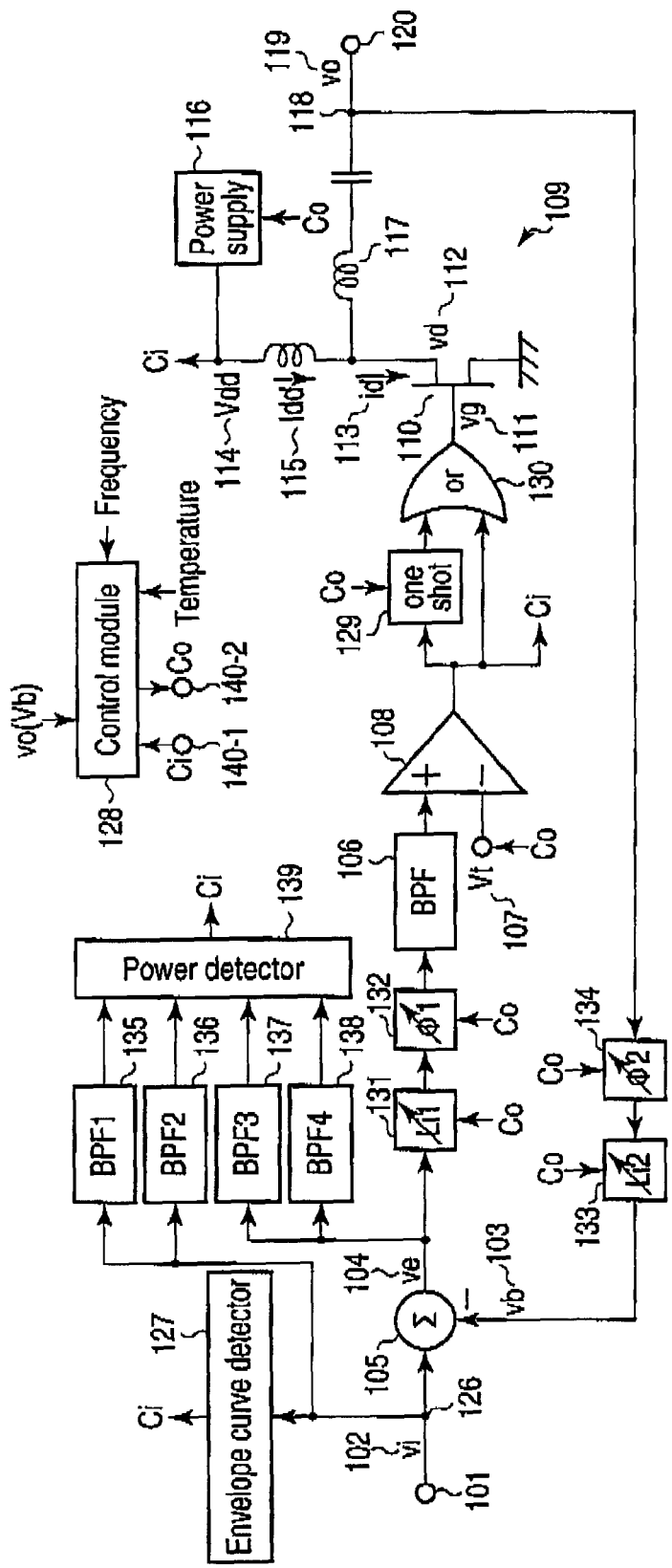
FIG. 15 is a circuit configuration diagram illustrating a power amplifier according to a second embodiment.

FIG. 15 is a circuit configuration diagram illustrating a second embodiment of a power amplifier. In addition to the configuration shown in FIG. 1 according to the first embodiment, FIG. 15 further includes a second coupler 126, an envelope curve detector 127, a control module 128, a one-shot circuit 129, an OR gate 130, a first variable attenuator 131, a first phase control circuit 132, a second variable attenuator 133, a second phase control circuit 134, a first bandpass filter 135, a second bandpass filter 136, a third bandpass filter 137, a fourth bandpass filter 138, and a power detector 139. The control module 128 improves various characteristics, such as distortion, by monitoring and controlling the power amplifier and its constituent elements, as shown in the following operation description.

The control module 128 inputs a monitor signal, such as data of an input signal (vi) and an output signal (vo), which will be described below, from required constituent elements, and outputs a control signal, a reference signal, and the like corresponding thereto. Each of the monitor and control signals are processed in a dedicated circuit or may be processed by a processor for inputting/outputting a digitally processed signal via an inner bus and the like. The latter is, in other words, designed to perform control by setting information such as a monitor signal as an input condition in advance, and storing a processing procedure for controlling the operation in accordance with the input information as a reference table or functions in an inner memory, and will be handled as means for embodying the control function. The following embodiments will mainly be described with reference to tables.

The input terminal (port) of a signal (information) to the control module 128 is indicated by 140-1, and the input signal is indicated by Ci. Further, the output terminal (port) from the control module 128 is indicated by 140-2, and the output signal is denoted by Co. The input signal Ci collectively refers to constituent elements of the power amplifier, such as the envelope curve signal input from the envelope curve detector 127, and signals, data, and information input from the outside. Similarly, the output signal Co collectively refers to signals and the like that control the constituent elements, and a reference table sets Co with respect to Ci. The constituent elements same as those of FIG. 1 are denoted by the same reference numerals and detailed description of such elements will be omitted.

As shown in FIG. 11 according to the first embodiment, the dynamic range in which the power amplifier is in an approximately linear shape is 11 dB, but loss of the switching element increases at high frequencies when the backoff amount is large. Accordingly, as shown in FIG. 15, an input monitor signal output from the second coupler 126 is input to an envelope curve detector 127, and the envelope curve signal detected by the envelope curve detector 127 is input to the control module 128 as Ci. The control module 128 varies the power supply voltage 114 by outputting a signal Co that controls the power supply 116 according to the level of the envelope curve signal of the high-frequency input signal 102.

Further, even in the domain in which the waveform is approximately linear in FIG. 11, its gradient may vary according to the frequency of the high-frequency input signal, or fluctuate according to the temperature of the switching amplifier 109. In the above-described configuration shown in FIG. 15, information indicating at least one of the frequency and the temperature is input to the control module 128. That is, at least one of frequency information of a frequency, which is externally set and at which transmission is performed, and temperature information from a temperature sensor, not shown, is input to the control unit 128 as Ci. The control module 128 compares the input information with the table in which the operation conditions are set with respect to input conditions, and varies the power supply voltage 114 by controlling the power supply 116 in accordance with at least one of the frequency and the temperature.

Figure 16A:
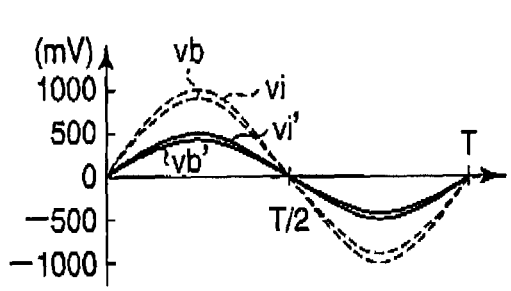
FIGS. 16A and 16B illustrate waveforms of signals according to the second embodiment.
Figure 16B:
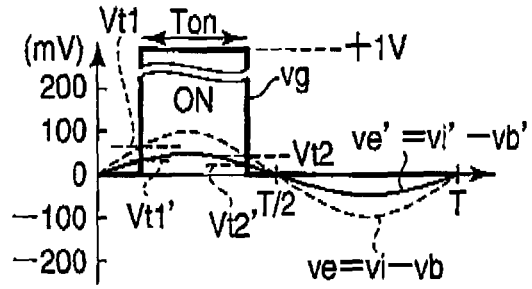

FIG. 16 illustrates waveforms of signals according to the second embodiment. FIG. 16A illustrates a high-frequency input signal vi' and a high-frequency feedback signal vb', which are input to the subtractor 105. FIG. 16B illustrates an error signal ve' output from the subtractor 105, a first threshold voltage Vt1' and a second threshold voltage Vt2' of the comparator 108, and vg output from the comparator 108. Further, FIGS. 16A and 16B illustrate vi, vb, and ve of FIGS. 2A and 2B in dashed lines.

As shown in FIGS. 16A and 16B, as the input signal vi is decreased to vi', the output signal also decreases and the feedback signal vb is also decreased to vb', thereby making the error signal ve also decreased to ve'. Accordingly, when the threshold voltages Vt1 and Vt2 are constant, Ton becomes zero, and a negative feedback is not applied. Further, when Vo/Vom<0.2 in FIG. 11, the negative feedback becomes unstable because of the large gradient and high gain. Since the maximum output power varies when the power supply voltage varies, DF will take different values even at the same output power. Further, when the optimum threshold voltage varies according to the frequency of the high-frequency input signal or the temperature of the switching amplifier 109, it is necessary to cope with such variation.

Accordingly, as shown in FIG. 15, a monitor signal Ci, obtained by monitoring a power supply voltage (Vdd; hereinafter simply referred to as power supply voltage Vdd) at a power reception terminal of the switching amplifier 109 by a detector (not shown), is input to the control module 128. The control module 128 generates a threshold control signal Co, which varies the threshold voltage 107 (the first threshold voltage Vt1 and the second threshold voltage Vt2) in accordance with at least one of the input power supply voltage Vdd, the envelope curve signal, frequency information of a high-frequency input signal, and temperature information, by referring to the table, and outputs the generated threshold control signal Co to the comparator 108.

Figure 17:
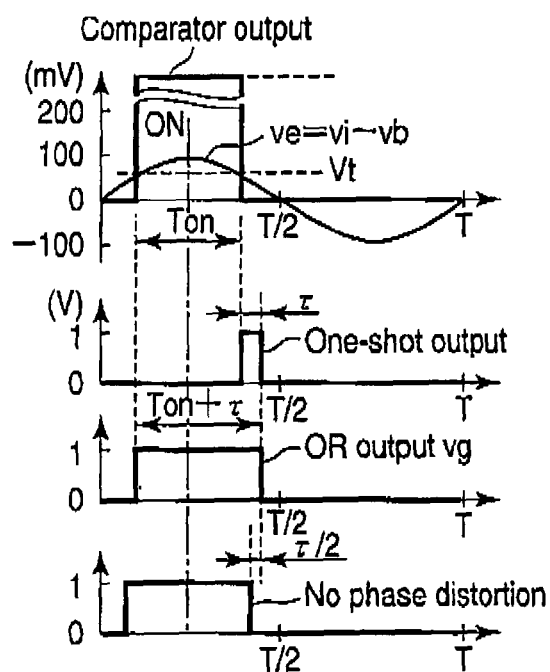
FIG. 17 illustrates an exemplary waveform of amplitude distortion compensation.

Further, since the gain decreases when Vo/Vom=0.7 (3 dB backoff) or more in FIG. 11, the amount of distortion improvement by the negative feedback is reduced. In order to obtain a gain equal to or higher than Vo/Vom=0.7, a one-shot circuit 129 and an OR gate 130 are connected after the comparator 108. The control module 128 switches the output of the one-shot circuit 129 from off to on when the output of the comparator 108 is turned off from on, as shown in FIG. 17, and turns off from on after a predetermined period of time t has elapsed. The switching amplifier 109 is operated on/off by an output vg of the OR gate 130 that uses a logical OR (Ton+τ) of the time Ton, when the comparator 108 is turned on, and a predetermined period of time τ.

Figure 18:
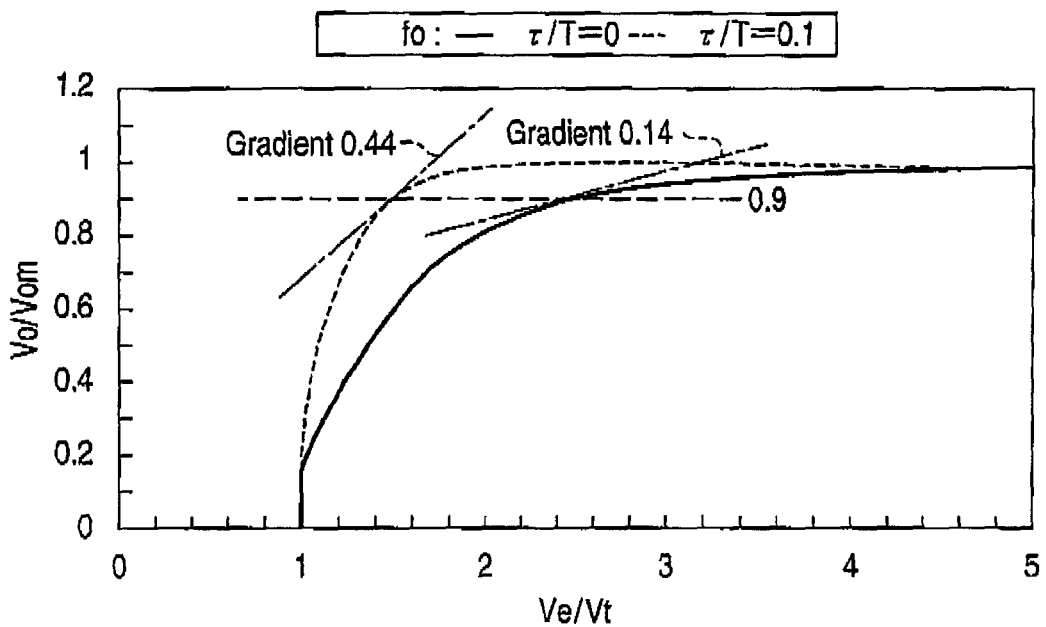
FIG. 18 illustrates an example of Vo/Vom with respect to Ve/Vt of the amplitude distortion compensation.
Figure 19:
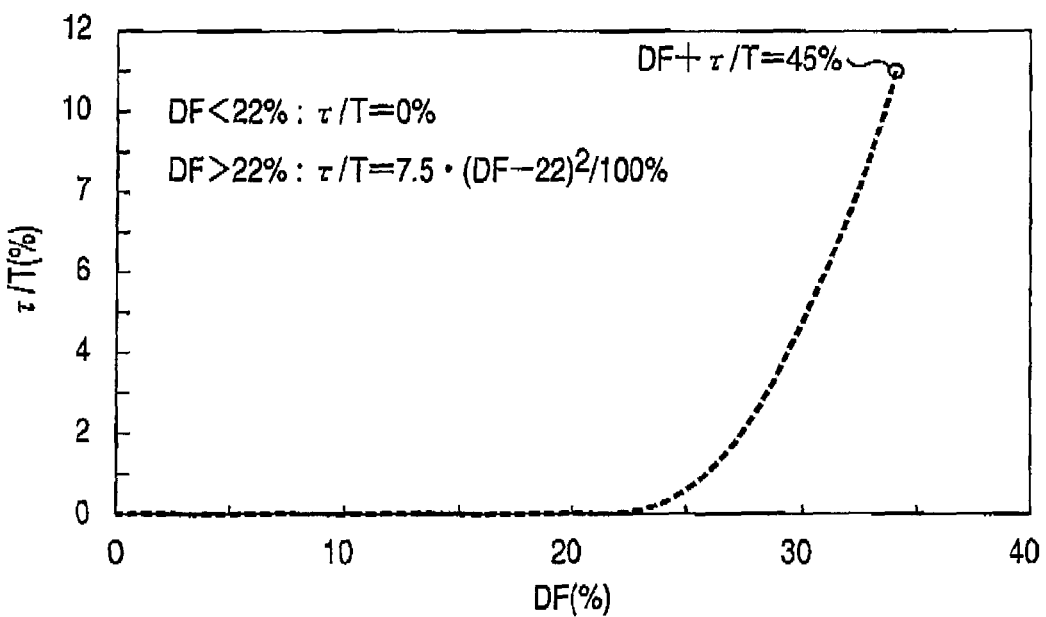
FIG. 19 illustrates an example of τ/T with respect to DF of the amplitude distortion compensation.

As shown in FIG. 18, when τ/T=0.1 at fo, the gradient at Vo/Vom=0.9 (0.9 dB backoff) is 0.44, which is three times greater than the gradient at τ/T=0. Alternatively, the output of the OR gate 130 of FIG. 15 does not need to be a direct gate voltage 111, and a first logic circuit may be configured to control a switch that switches the gate voltage 111 to one of an ON voltage or an OFF voltage using the output of the OR gate 130.

Figure 20:
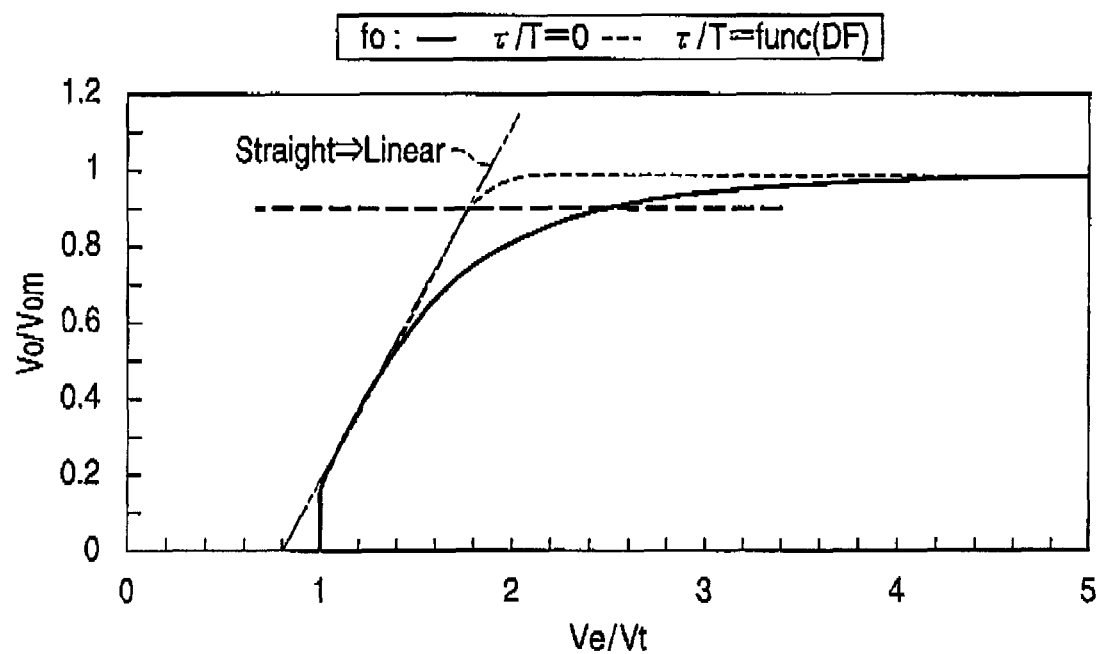
FIG. 20 shows an example of Vo/Vom with respect to Ve/Vt of the amplitude distortion compensation.

As shown in FIG. 18, however, when τ/T=0.1 as a constant value, the negative feedback becomes unstable, because of a high gradient and a high gain. Accordingly, as shown in FIG. 15, the pulse signal output from the comparator 108 is input to the control module 128. The control module 128 generates a control signal Co, which sets τ as τ=0 when DF<22%, and as a quadratic function of DF when DF>22%, based on the input pulse signal. After that, Co is output to the one-shot circuit 129, and the time t during which the one-shot circuit 129 is turned on is controlled. As a result, as shown in FIG. 20, the waveform becomes approximately linear throughout Vo/Vom=0.2 to 0.9 (14 to 0.9 dB backoff).

Figure 21A:
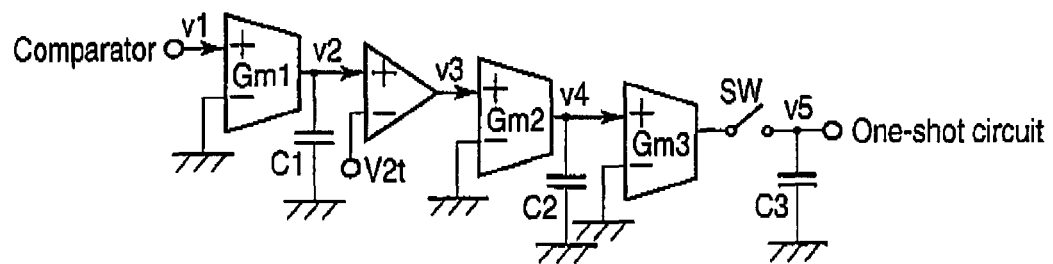
FIGS. 21A and 21B illustrate configuration examples of a τ generation circuit according to the second embodiment.
Figure 21B:
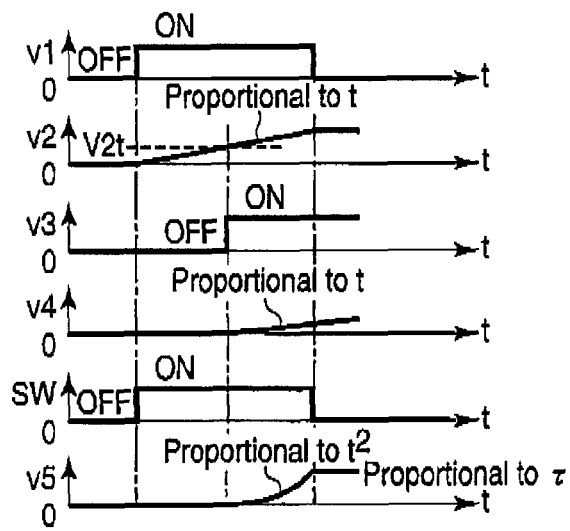

FIGS. 21A and 21B illustrate a circuit configuration example in a control module 128 that generates τ. The output pulse v1 of the comparator 108 is integrated into v2 in a Gm1-C1 circuit, and the output of the comparator that is turned on when v2 is greater than or equal to V2t is set to v3. The output v3 is integrated in a Gm2-C2 circuit into v4, and v4 is integrated in a Gm3-C3 circuit into v5. A switch SW, which is opened when the output pulse v1 of the comparator 108 is turned off, holds v5, and v5 controls τ of the one-shot circuit 129.

In this way, the amplitude distortion can be compensated by controlling τ in each cycle in real time. The above-described case is an example of a dedicated circuit configured to control the operation in accordance with the input information. In FIG. 21, constituent elements other than those necessary for describing the basic operation are omitted. Further, by setting τ as a high-level function, an approximately linear waveform can be obtained until the upper limit of DF=45% (0.2 dB backoff), in which the differential coefficient 1.01·fo of FIG. 10 avoids the negative domain.

Further, the amplitude distortion of the output signal is effected by the power supply voltage Vdd, the envelope curve signal, the frequency of the high-frequency input signal, and the temperature of the switching amplifier 109. In other words, when Vo/Vom varies with respect to Ve/Vt of FIG. 20, the control module 128 generates an adjustment signal that varies τ according to the input frequency variation or temperature variation by referring to the table, and compensates for the amplitude distortion by outputting the generated adjustment signal to the one-shot circuit 129.

AS described above, when the amplitude distortion is compensated by applying τ in the one-shot circuit 129, the OR output voltage vg of FIG. 17 delays from the center of Ton by τ/2. This delay promotes the phase distortion in which θ decreases as Vo/Vom increases when Vo/Vom is greater than or equal to approximately 0.3, as shown in FIG. 14.

Accordingly, a first variable attenuator 131 and a first phase control circuit 132 are inserted between the subtractor 105 and the comparator 108. The control module 128 inputs information indicating at least one of the pulse signal output from the comparator 108, the power supply voltage Vdd, the envelope curve signal, the frequency of the high-frequency input signal, and the temperature of the switching amplifier 109, as a preset monitor input signal Ci.

By referring to the table storing the adjustment amount for correcting distortion with respect to the input conditions, adjustment is performed by outputting Co, which varies at least one of the attenuation amount of the first variable attenuator 131 and the phase shift of the first phase control circuit 132 according to the input information. (The adjustment procedure and amount of input conditions, such as Ci, are programmed inside the control module 128 in advance and output.) It is to be noted that a first variable "gain amplifier" may be used instead of the first variable "attenuator" 131.

Further, as shown in FIG. 15, a second variable attenuator 133 and a second phase control circuit 134 are inserted between the first coupler 118 and the subtractor 105. When the first coupler 118 and the subtractor 105 fluctuate by the frequency of the high-frequency input signal or the temperature of the switching amplifier 109, the feedback ratio β, which will be described below, varies and the gain and phase shift of the power amplifier also vary. In order to suppress such variation, compensation needs to be performed by storing the frequency and temperature characteristics of the feedback ratio β.

That is, a case will be considered where the gain and phase shift of the power amplifier is set in advance. At least one information of the frequency of a specified high-frequency input signal, and the temperature of the switching amplifier 109 is input to the control module 128. Data for adjusting the second variable attenuator 133 and the second phase shift circuit 134 is stored as a table in accordance with the input information so as to obtain the preset gain or phase shift. The control module 128 outputs a control signal for adjusting the attenuation amount and shift phase to the second variable attenuator 133 and the second phase control circuit 134 by comparing the input information with the table. As a result of the adjustment, the feedback ratio β becomes a predetermined feedback ratio.

Further, the second variable "attenuator" 133 may be a second variable "gain amplifier" instead. With respect to information relating to gain, as will be described below, measurement values of an input signal power, an error signal power, and an output signal (feedback signal) power are input to the control module 128, and the control module 128 calculates a gain using these power values as gain information. In calculating the gain, when the power detector 139 fluctuates by the frequency of a high-frequency input signal or the temperature of the switching amplifier 109, for example, compensation may be formed similarly.

Next, the distortion improvement amount by the negative feedback and the like will be described. FIG. 22 illustrates a configuration example of a negative feedback circuit. In FIG. 22, Vo/Vi and Ve/Vi can be expressed as follows:

$$Vo/Vi = (A + Ni/Vi)/(1 + A \cdot \beta)$$

$$Ve/Vi = (1 - \beta \cdot Ni/Vi)/(1 + A \cdot \beta)$$

where $A = Ao \cdot (1+\delta)$ denotes an open loop gain, δ denotes a distortion, β denotes the feedback ratio, A·β denotes the loop gain, Vi denotes an input signal, Ve denotes an error signal, Ni denotes noise, and Vo denotes an output signal.

When $\delta \ll 1$ and $Ni/Vi \ll 1$, the following relations are satisfied:

$$Vo/Vi=\{1+\delta/(1+Ao\cdot\beta)\}\cdot Ao/(1+Ao\cdot\beta)+Ni/Vi/(1+Ao\cdot\beta)$$

$$Ve/Vi=\{1-\delta\cdot Ao\cdot\beta/(1+Ao\cdot\beta)\}/(1+Ao\cdot\beta)-Ni/Vi\cdot\beta/(1+Ao\cdot\beta).$$

Further, when $Ao\cdot\beta \gg 1$, the following relations are satisfied:

$$Vo/Vi=\{1+\delta/(Ao\cdot\beta)\}/\beta \leftrightarrows Ni/Vi/(Ao\cdot\beta)$$

$$Ve/Vi=(1-\delta)/(Ao\cdot\beta)-Ni/Vi/Ao.$$

From the above, when $Ao\cdot\beta \rightarrow \infty$, an improvement amount of distortion of the output signal and noise by the negative feedback is $(1+Ao\cdot\beta) \rightarrow Ao\cdot\beta$, and the closed loop gain is $Ao/(1+Ao\cdot\beta) \rightarrow 1\beta$. Further, the gain Ve/Vi of the error signal with respect to the input signal is $1/(1+Ao\cdot\beta) \rightarrow 1/(Ao\cdot\beta)$.

In the configuration of FIG. 15, of the constituent elements of the loop except the negative feedback bandpass filter 106, i.e., the subtractor 105, the first variable attenuator 131, the first phase control circuit 132, the negative feedback bandpass filter 106, the comparator 108, the one-shot circuit 129, the OR gate 130, the switching amplifier 109, the first coupler 118, the second phase control circuit 134, and the second variable attenuator 133, the switching amplifier 109 including the output-side tuning circuit 117 has the longest group delay time, which is approximately T when Vo/Vom=1 (0 dB back-off) in FIG. 14. Since the other circuits are either logic circuits or broadband analogue circuits, the group delay time can be shortened. Accordingly, the group delay time of the loop other than the negative feedback bandpass filter 106 can be easily set to approximately $\tau g=3\cdot T$, for example.

Figure 24:
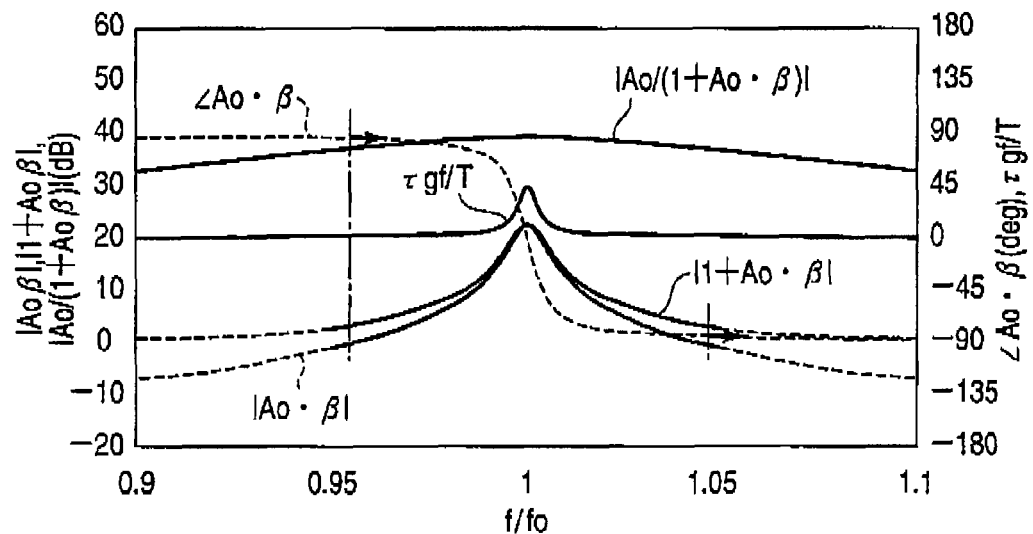
FIG. 24 illustrates an example (fo, Ao·β=22 dB, τg/T=0) of a closed loop gain and a distortion improved amount.

FIG. 23 illustrates a Nyquist diagram of $Ao\cdot\beta$ of the case where the group delay time other than the negative feedback bandpass filter 106 is $\tau g/T=0$, when the negative feedback bandpass filter 106 is a serial resonance circuit of Q=270, in which Ao=62 dB∠0 degrees and $\beta$=−40 dB∠40 degrees at fo. In the overall view of the dashed line, when the frequency is increased from low frequencies, a circle with radius 6.2 is drawn in a clockwise direction upward from (0, 0), passes through (12.4, 0) at fo, and returns to (0, 0). Since the circle does not turn around (−1, 0) in a clockwise direction in a real exploded view, the circle is stable. Next, FIG. 24 illustrates a closed loop gain, a distortion improvement amount, and the like. The frequency at which $|Ao\cdot\beta|$=0 dB has an angle of $\angle Ao\cdot\beta$=±85 degrees at fo±0.05·fo and has a phase margin of approximately 95 degrees, and is therefore stable. In the fractional bandwidth BW/fo=0.01, the closed loop gain $|Ao/(1+Ao\cdot\beta)|$ is maximized at approximately 39 dB, and the distortion improvement amount $|1+Ao\cdot\beta|$ is approximately 18 to 22 dB. Further, since the out-of-band distortion improvement amount $|1+Ao\cdot\beta|$ is greater than or equal to 0 dB, the gain $|Ve/Vi|=1/|1+Ao\cdot\beta|$ of the error signal with respect to the input signal is less than or equal to 0 dB. It is to be noted that the negative feedback bandpass filter 106 has a long group delay time of $\tau gf/T$=43 at fo.

Figure 25:
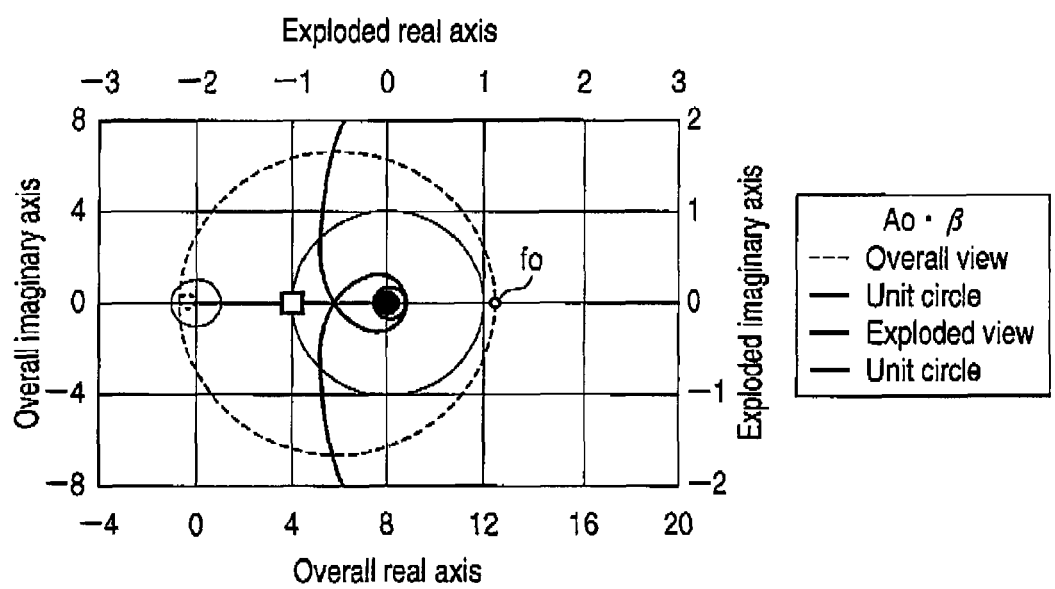
FIG. 25 illustrates another example (fo, Ao·β=22 dB, τg/T=3) of a Nyquist diagram.
Figure 26:
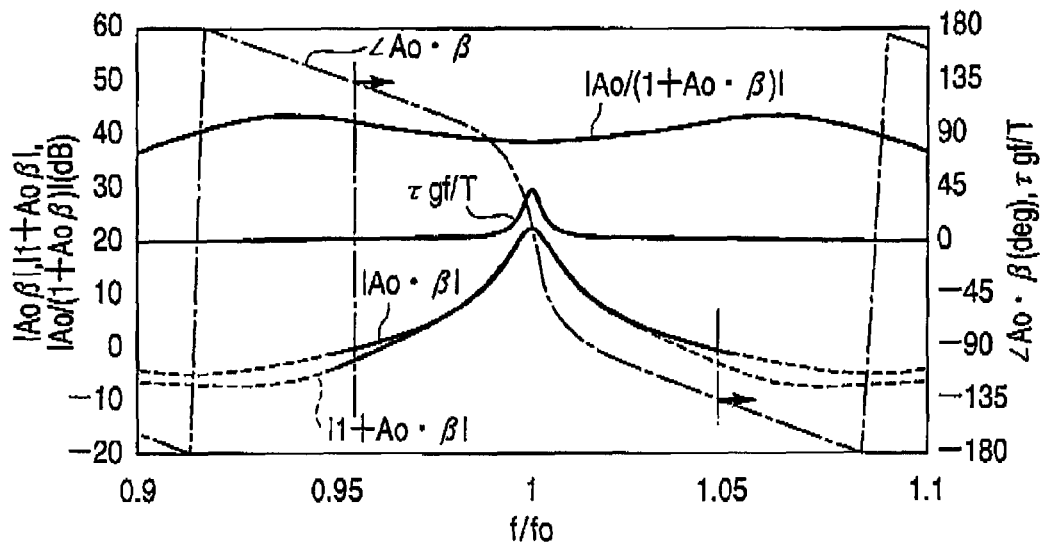

Next, a Nyquist diagram of the case where $\tau g/T$=3 is shown in FIG. 25. The vicinity of fo in the dashed overall view of the dashed line is almost the same as that of the case where $\tau g/T$=0 shown in FIG. 23. The curve does not turn around (−1, 0) in the clockwise direction in the real exploded view and is therefore stable. FIG. 26 illustrates a closed loop gain and a distortion improvement amount. The frequency at which $|Ao\cdot\beta|$=0 dB has an angle of approximately $\angle Ao\cdot\beta$=±135 degrees and has a phase margin of 45 degrees at fo±0.05·fo, and is therefore stable. In the fractional bandwidth BW/fo=0.01, the closed loop gain $|Ao/(1+Ao\cdot\beta)|$ is approximately 39 dB, and the distortion improvement amount $|1+Ao\cdot\beta|$ is approximately 18 to 22 dB, which is almost the same as $\tau g/T$=0. At approximately fo±0.07·fo, however, the closed loop gain $|Ao/(1+Ao\cdot\beta)|$ becomes approximately 44 dB and the distortion improvement amount $|1+Ao\cdot\beta|$ becomes approximately −7 dB. Accordingly, the gain $|Ve/Vi|=1/|1+Ao\cdot\beta|$ of the error signal with respect to the input signal is a positive gain of approximately +7 dB. It is to be noted that the negative feedback bandpass filter 106 has a long group delay time of $\tau gf/T$=46 (=43+3) at fo.

Figure 27:
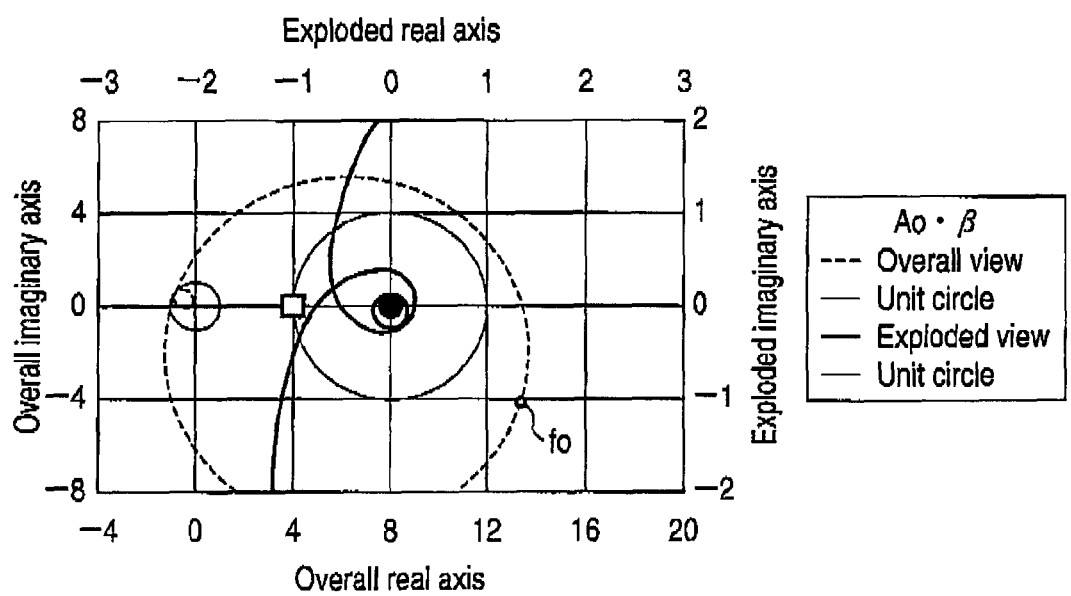
FIG. 27 illustrates another example (fo, |Ao·β=22+1 dBτg/T=3+0.05) of a Nyquist diagram.
Figure 28:
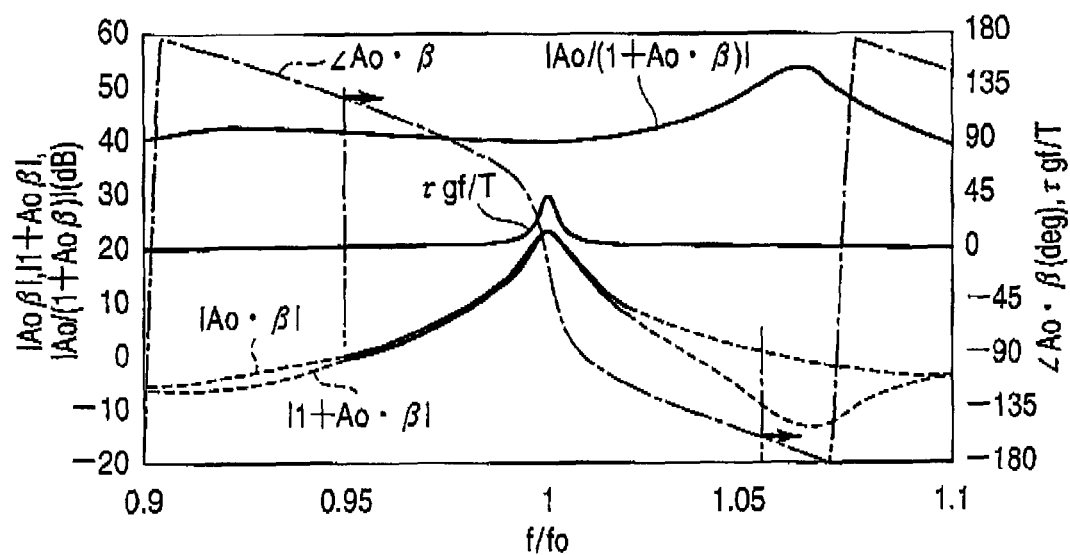
FIG. 28 illustrates another example (fo, |Ao·β=22+1 dB, τg/T=3+0.05) of a closed loop gain and a distortion improved amount.

FIG. 27 illustrates a Nyquist diagram of the case where the gain is increased by +1 dB to $|Ao\cdot\beta|$=23 dB, the group delay time is increased by +0.05·T (θ is −18 degrees at fo), and $\tau g/T$=3.05. The overall view of the dashed line falls diagonally right down and passes through (13.3, −4.1) at fo. The curve approximates (−1, 0) at high frequencies in the real exploded view, but is stable since it still does not turn around (−1, 0) in the clockwise direction. FIG. 28 illustrates a closed loop gain, a distortion improvement amount, and the like. The frequency at which $|Ao\cdot\beta|$=0 dB has an angle of approximately $\angle Ao\cdot\beta$=+124 degrees and has a phase margin of 56 degrees at fo−0.050·fo at low frequencies, but has an angle of $\angle Ao\cdot\beta$=−161 and a phase margin of 19 degrees at fo+0.053·fo at high frequencies. In the fractional bandwidth BW/fo=0.01, the closed loop gain $|Ao/(1+Ao\cdot\beta)|$ is approximately 39 dB, which does not vary greatly from that of FIG. 26, but the distortion improvement amount $|1+Ao\cdot\beta|$ is approximately 19 to 23 dB, which is approximately 1 dB greater than that of FIG. 26. Further, the closed loop gain $|Ao/(1+Ao\cdot\beta)|$ is approximately 42.3 dB at fo−0.076·fo, and approximately 52.6 dB at fo+0.063·fo, and the distortion improvement amount $|1+Ao\cdot\beta|$ is approximately −6.6 dB at fo−0.087·fo, and approximately −14.1 dB at fo+0.063·fo. Accordingly, the gain $|Ve/Vi|=1/|1+Ao\cdot\beta|$ of the error signal with respect to the input signal is a positive gain of approximately +14.1 dB at fo+0.063·fo. It is to be noted that the group delay time of the negative feedback bandpass filter 106 is approximately $\tau gf/T$=46 at fo, which is almost the same as that of FIG. 26. Thus, the negative feedback can be stabilized by monitoring and controlling the out-of-band closed loop gain or the gain of the error signal.

When the gain further increases, or the group delay time increases, the negative feedback becomes unstable. Accordingly, as shown in FIG. 15, for example, a first bandpass filter 135 and a second bandpass filter 136 connected to an input terminal of the subtractor 105, and a third bandpass filter 137 and a fourth bandpass filter 138 connected to the output terminal of the subtractor 105, and a power detector 139 configured to detect the power of output from each of the first to fourth bandpass filters are further provided, and the gain in each bandwidth is measured as will be described below.

The first bandpass filter 135 lets a low-frequency signal (vi) lower than the frequency of the high-frequency input signal 102 to pass through, and the second bandpass filter 136 lets a high-frequency signal (vi) higher than the frequency of the high-frequency input signal 102 to pass through. The third bandpass filter 137 lets a low-frequency signal lower than the frequency of a high-frequency input signal 102 in an error signal (ve) from the subtractor 105 to pass through, and the fourth bandpass filter 138 lets a high-frequency signal higher than the frequency of the high-frequency input signal 102 in the error signal (ve) from the subtractor 105 to pass through.

The control module 128 inputs information Ci of each power detected by the power detector 139, and obtains the ratio of power of the output terminal of the subtractor 105 to the power of the input terminal of the subtractor 105, and the error signal gain of ve/vi in both low frequencies and high frequencies. The control module 128 outputs an adjustment signal Co so as to control the first variable attenuator 131 and the first phase control circuit 132. Thereby, the attenuation amount is increased when the gains at both high frequencies and low frequencies are greater than a certain gain, and is decreased in a reverse case, such that the gains at both high frequencies and low frequencies become constant.

Referring to FIGS. 26 and 28, the signal frequency corresponds to a normalized value (f/f0)=1, and the first and third bandpass filters 135, 137, for example, have pass bands around the normalized value 1.05, and the second and fourth bandpass filters 136, 138 have pass bands around 0.95. In FIG. 28, the value of |1+Ao·β|, which is the reverse value of the gain of the error signal drops in a valley shape at around the normalized frequency 1.05, and is almost flat at around 0.95. Accordingly, the control module 128 controls the first variable attenuator 131 and the first phase control circuit 132, and has characteristics of |1+Ao·β| as shown in FIG. 26.

The above-described case is about the gain of the error signal, but the closed loop gain of a power ratio (vo/vi or vb/vi) of the output signal to the input signal may be similarly measured. That is, the control module 128 inputs power information of an output signal (vo) (or a feedback signal (vb) input to the subtractor 105) and measures the gain of each bandwidth. Illustration and the like of the bandpass filter in this case will be omitted.

The first variable "gain amplifier" may be used instead of the first variable "attenuator" 131 as the gain adjustment means.

Further, when an appropriate constant gain varies according to the power voltage of the reception power terminal of the amplifier, the input signal envelope curve, the frequency of the high-frequency input signal, or the temperature of the switching amplifier 109, the control module 128 stabilizes the negative feedback by applying a constant gain in accordance with them, based on information stored in advance at the time of adjustment.

Third Embodiment

Figure 29:
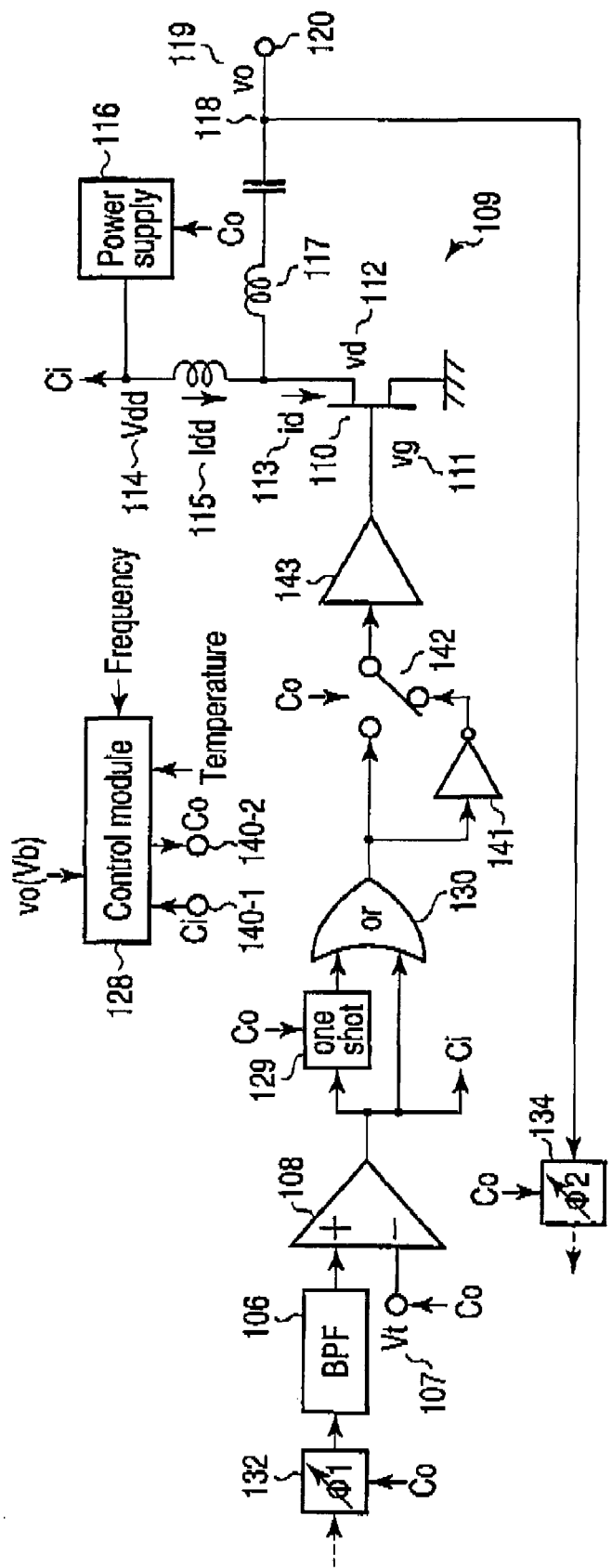
FIG. 29 is a circuit configuration diagram illustrating a power amplifier according to a third embodiment.

FIG. 29 is a circuit configuration illustrating a third embodiment of a power amplifier. In FIG. 29, when the phase shift of the first phase control circuit 132 needs to be varied by greater than or equal to 180 degrees, an inverter 141 that uses the output of the OR gate 130 as an input, and a switching switch 142 configured to connect an output terminal of at least one of the OR gate 130 and the inverter 141 to the input terminal of the switching amplifier 109 are added, and the control signal Co that causes the control module 128 to switch the switching switch 142 is output to the switching switch 142 and the phase shift is varied by 180 degrees. Thereby, the phase shift that the first phase control circuit 132 must vary can be reduced. Further, instead of the inverter 141 and the switching switch 142, a second logic circuit may be used, such as an exclusive-OR (EXOR) gate.

Moreover, when the output of the switching switch 142 is an on/off pulse between 1 and 0 V, GaN HEMT of the switching element 110 has a cutoff at Vgs=−3 V and is saturated at Vgs=+1 V (Isat), a pulse amplifier 143 that also functions as a level shift is inserted in the preceding stage of the switching amplifier 109.

Fourth Embodiment

Figure 31:
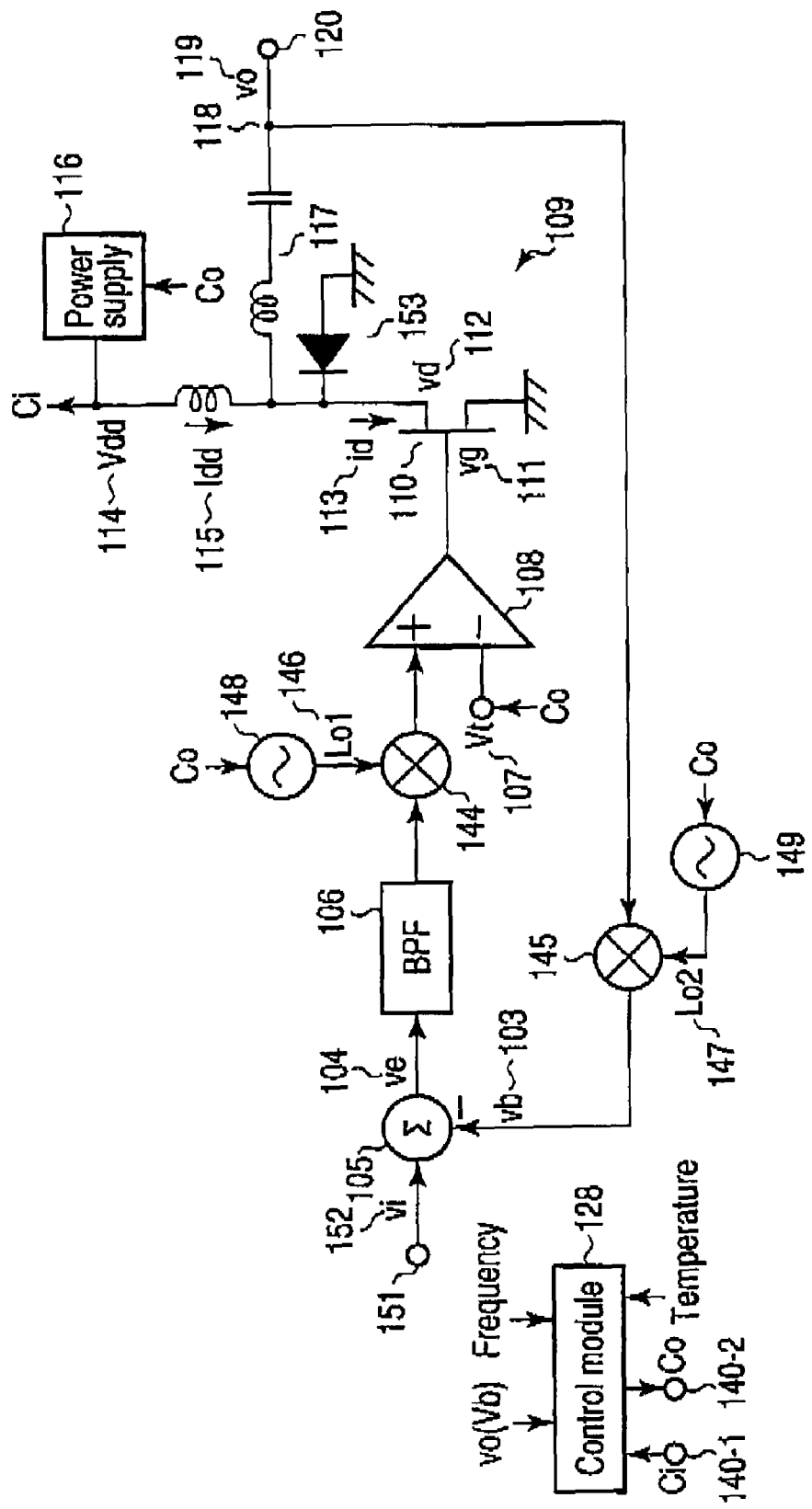
FIG. 31 is a circuit configuration diagram illustrating another configuration of the fourth embodiment.

FIGS. 30 and 31 illustrate circuit configurations illustrating a power amplifier according to a fourth embodiment. Since the drain voltage of a class E amplifier may become negative in an off-state when the frequency is deviated from the central frequency fo, the gate bias needs to be set large in an off-state such that a high forward current does not flow to the gate of a Schottky-joined GaN HEMT gate. For that purpose, difficulty of the circuit (comparator 108) that drives the gate is increased. However, the gate bias does not need to be set high by inserting a diode 150 in series at the output terminal of the switching element 110, as shown in FIG. 30, or by connecting a diode 153 in a reverse direction between the output terminal of the switching element 110 and the ground as shown in FIG. 31.

Further, although dimensions and weight necessarily increase in order to reduce loss of the high-frequency bandpass filter, an intermediate frequency type can be embodied using a small Si IC. Accordingly, as shown in FIG. 30, for example, in order to make the operation band of the negative feedback bandpass filter 106 an intermediate frequency, frequency converters 144, 145 are inserted in an interface between high frequencies and intermediate frequencies, and local signal generators 148, 149 that generate local signals 146, 147, respectively, are added. This is the case where one of the negative feedback bandpass filter 106, the first bandpass filter 135, the second bandpass filter 136, the third bandpass filter 137, the fourth bandpass filter 138, the power detector 139, the first variable attenuator 131, the second variable attenuator 133, the first phase control circuit 132, the second phase control circuit 133, the first phase control circuit 132, the second phase control circuit 133, the subtractor 105, and the envelope curve detector 127 is set at intermediate frequencies. Only portions will be described with reference to the following embodiments, for the sake of simplification.

Further, as shown in FIG. 31, the operation band of the subtractor 105 is also set to intermediate frequencies, the high-frequency input terminal 101 that uses the high-frequency input signal 102 as an input is replaced with an intermediate-frequency input terminal 151 that uses an intermediate frequency input signal 152 as an input, and frequency converters 144, 145 are inserted into an interface between high frequencies and intermediate frequencies.

Fifth Embodiment

Figure 32:
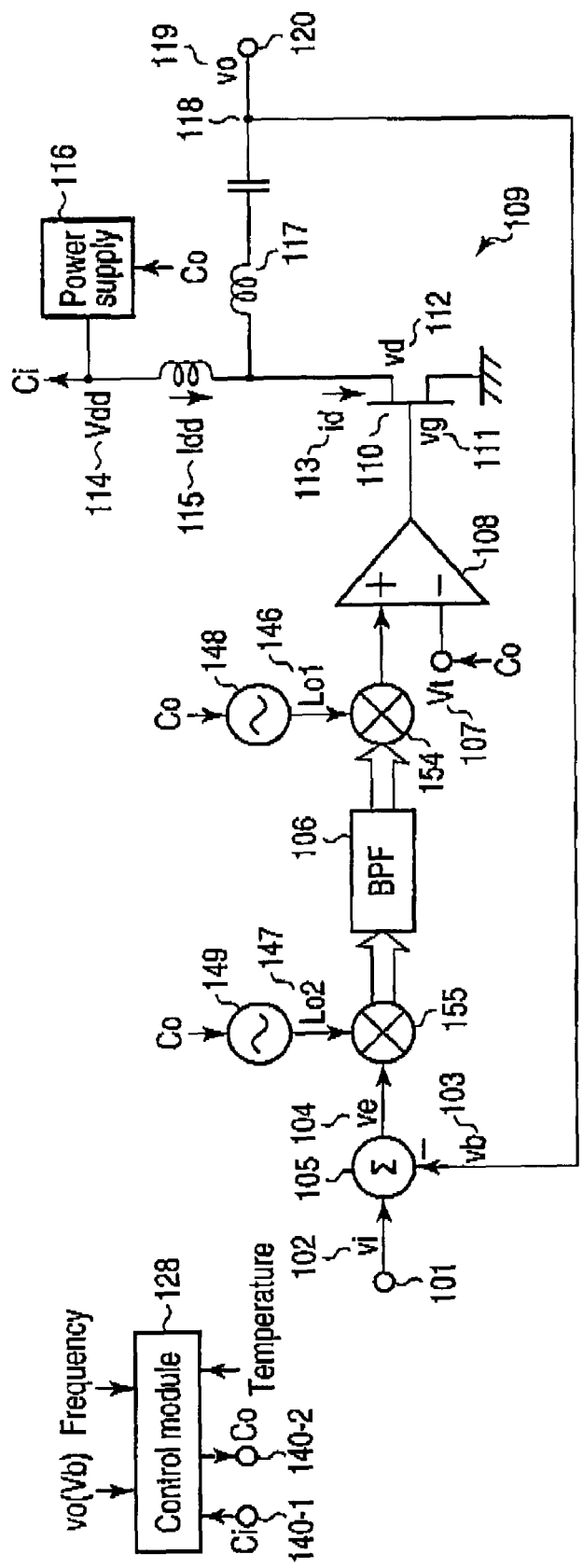
FIG. 32 is a circuit configuration diagram illustrating a power amplifier according to a fifth embodiment.

FIG. 32 is a circuit configuration illustrating a fifth embodiment of a power amplifier. Even when the modulation bandwidth is great, the frequency can be lowered by setting an intermediate frequency of an in-phase/quadrature (I/Q), and thereby difficulty in high performances of IC can be lowered. Accordingly, as shown in FIG. 32, the operation band of the negative feedback bandpass filter 106 and the frequency converters 154, 155 is set as an I/Q intermediate frequency.

Sixth Embodiment

Figure 33:
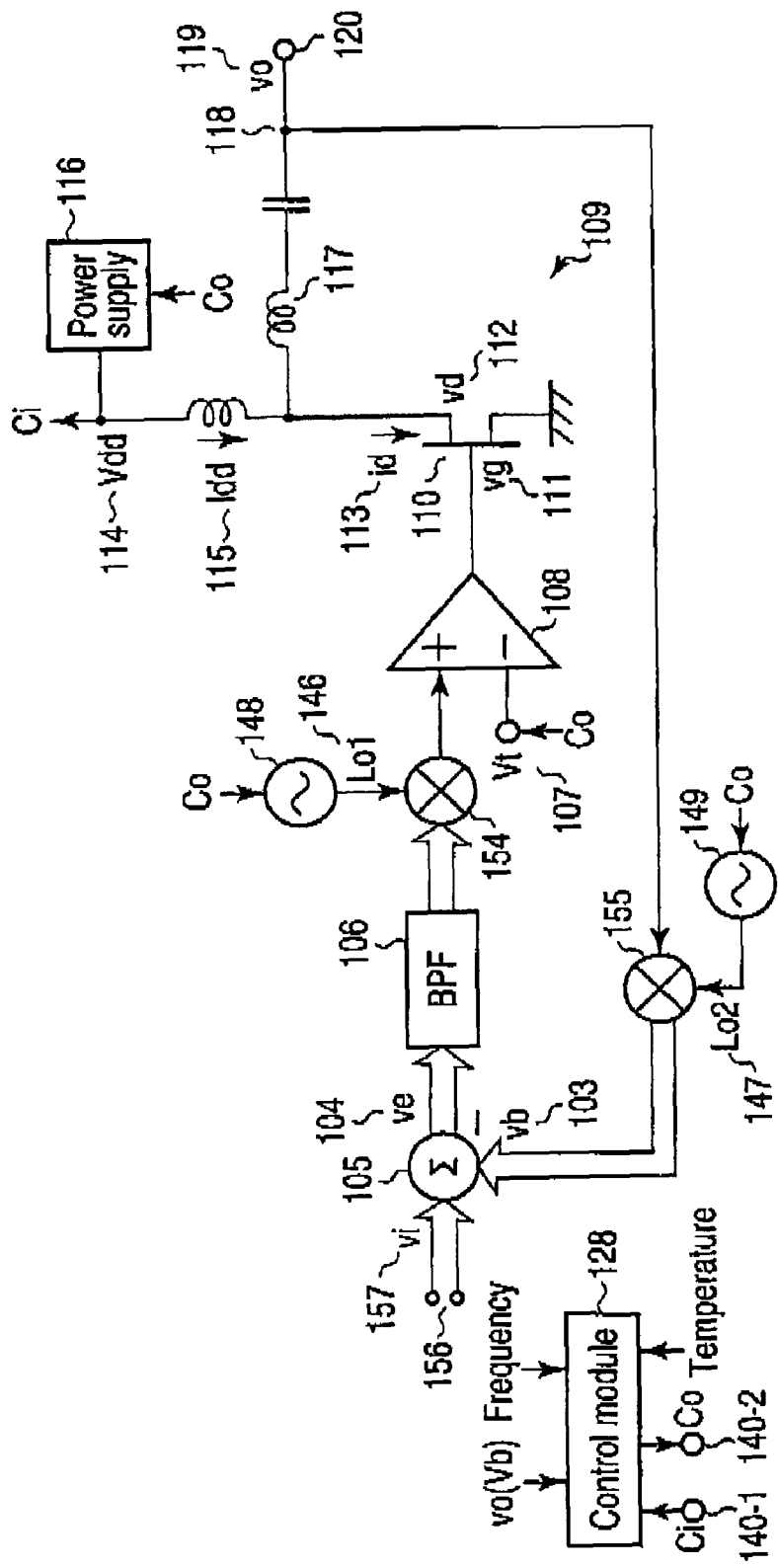
FIG. 33 is a circuit configuration diagram illustrating a power amplifier according to a sixth embodiment.

FIG. 33 is a circuit configuration diagram illustrating a sixth embodiment of a power amplifier. For example, as shown in FIG. 33, when the operation band of the subtractor 105 is an I/Q intermediate frequency, the input terminal is set to an I/Q intermediate frequency input terminal 156, and the input terminal is set to an I/Q intermediate frequency input signal 157. For example, an I/Q intermediate frequency in FIG. 32 is set to 0 Hz. For example, an I/Q intermediate frequency of FIG. 33 is set to 0 Hz and the input terminal is set to an I/Q base band input terminal 158, and the input signal is set to an I/Q base band input signal 159, as shown in FIG. 34. That is, the I/Q base band signal can be directly input. It is to be noted that the negative feedback bandpass filter 106 of the case where the I/Q intermediate frequency of 0 Hz is used in a base band signal is replaced with a low-frequency bandpass filter.

Seventh Embodiment

FIG. 34 is a circuit configuration illustrating a seventh embodiment of a power amplifier. Information on local frequencies of local signal generators 148, 149 is input to the control module 128, and the control module 128 controls the local signal generator 148 and varies the frequency of the local signal. For example, when the control module 128 controls the first local signal generator 148 and the second local signal generator 149 so as to vary the phase of the first local signal 146 and the second local signal 147 of FIG. 34, the phase shift can be varied in place of the first phase control circuit 132 and the second phase control circuit 134 of FIG. 15. For example, when the amplitude distortion is compensated by applying τ in the one-shot circuit 129, the OR output vg of FIG. 17 is delayed by τ/2 from the center, and the control module 128 controls the phase of the phase lock loop synthesizer of the first local signal generator 148 and advances phase of the error signal.

It is to be noted that a local signal may be input externally instead of the local signal generator 148. In that case, adjustment should be performed in accordance with the case where the local signal generator is used. Alternatively, although not shown, a phase shifter may be inserted between a local signal generator and a frequency converter, the phase shifter is controlled by the control module 128, and the phase of the local signal may be varied. For example, when the temperature characteristics of the phase of the feedback ratio β pose a problem, the temperature characteristics are stored in a reference table in advance, the control module 128 of FIG. 34 controls a phase shifter (not shown) inserted between the second local signal generator 149 and a frequency converter 155 in accordance with the temperature of the switching amplifier, and thereby the temperature of the phase of the feedback ratio β is compensated.

Eighth Embodiment

FIG. 35 is a circuit configuration diagram illustrating an eighth embodiment of a power amplifier. For example, when the response rate of the power supply 116 is late, a delay is caused when the control module 128 controls the power supply 116 upon receipt of an envelope curve signal from the envelope curve detector 127 in FIG. 35. Accordingly, the present configuration performs control of correcting and switching the delay time by inserting a signal processing module 160 between the high-frequency input terminal 101 and the subtractor 105.

Although the inside is not shown, the signal processing module 160 comprises a frequency conversion function of converting a high-frequency input signal into a base band or a signal processing signal such as an intermediate frequency signal, a frequency re-conversion function of reverting the converted signal into an original high-frequency signal, a delay addition function of applying a delay to the signal processing signal, and an envelope curve output function of outputting the envelope curve by detecting the wave of the input signal. The signal processing performed by the signal processing module 160 is monitored and controlled by Ci and Co, input and output to and from the control module 128.

Upon receipt of the envelope curve signal from the envelope curve detector 127 as shown in FIG. 15, the control module 128 stores the value of the delay time td, at which a required power supply voltage is reached when the power supply 116 is controlled in an inner memory. The delay time td is measured by the operator at the time of adjustment by an operator, or the power supply voltage Vdd on the power reception terminal of the switching amplifier 109 is monitored as Ci when the control module 128 is operated, compared by the control module 128 with the control signal Co output to the power supply 116, and is stored after the delay time td is calculated.

The signal processing module 160 outputs the envelope curve signal of the input signal as Ci to the control module 128. The control module 128 corrects the delay by outputting a delay control signal Co, which outputs a signal that the signal processing module 160 has re-converted with the delay of the delay time td as an input signal (vi') 161 to the subtractor 105, to the signal processing module 160.

In the signal processing module 160, while the envelope curve signal is output, an input signal, which is a high-frequency signal of a frequency of a transmission wave, is converted into a processing signal, which is an intermediate frequency signal, an I/Q intermediate frequency signal, or an I/Q base band signal. After that, signal processing is performed at low frequencies, such as a base band signal, and the delay time td is added, and then the signal processing signal is reverted into a high-frequency signal and output. Thereby, difficulty in increasing precision of the delay time td is lowered. A design or a measurement value preset by the response characteristics of the circuit may be used as the delay time td, or the circuit operation may be monitored and dynamically changed, as described above.

Ninth Embodiment

Figure 36:
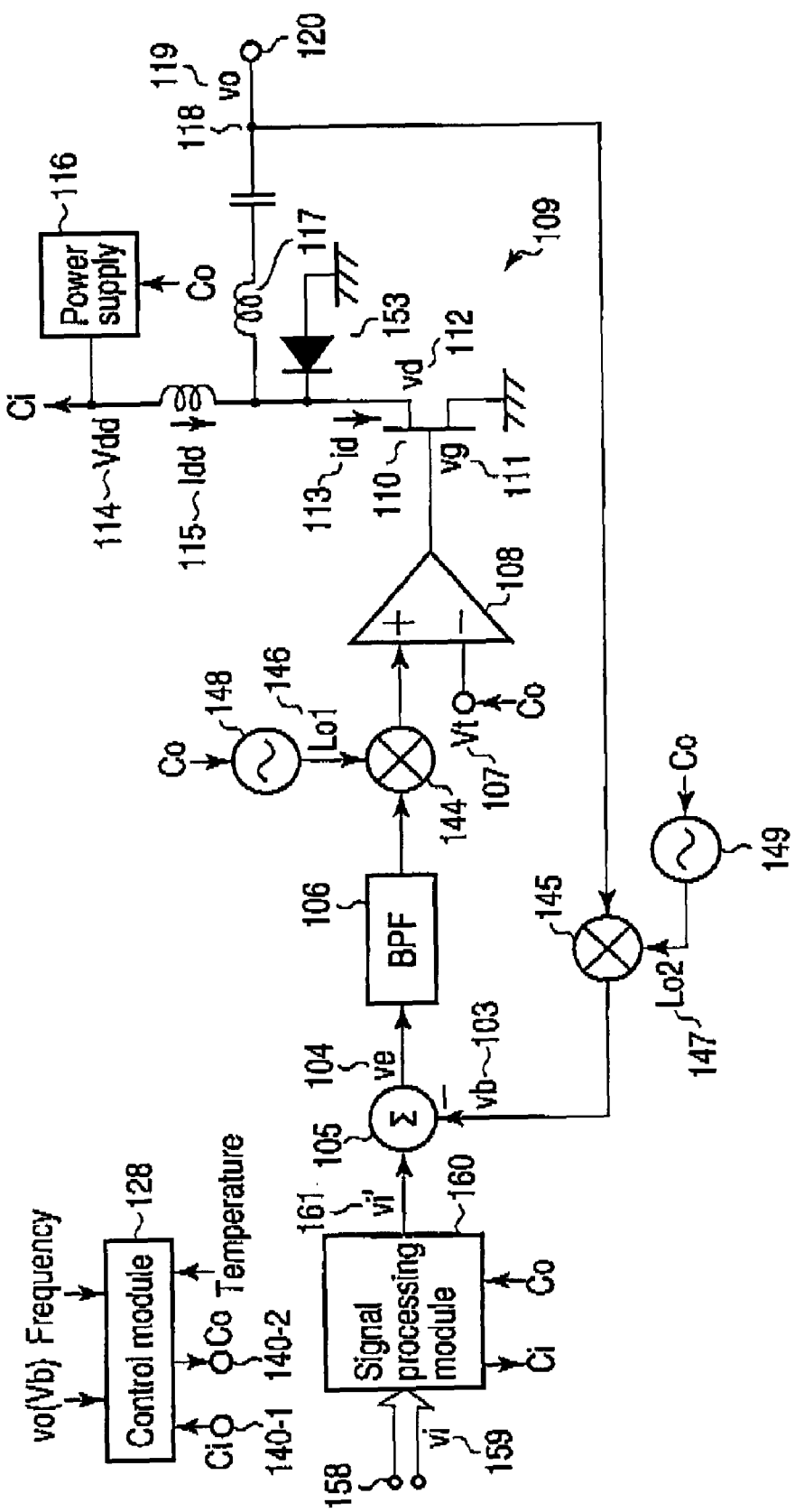
FIG. 36 is a circuit configuration diagram illustrating a ninth embodiment of a power amplifier.

FIG. 36 is a circuit configuration diagram illustrating a ninth embodiment of a power amplifier. For example, by inputting an I/Q base band signal (vi) 159, as shown in FIG. 36, the processing conversion circuit is deleted. Thereby, the I/Q baseband signal can be directly input.

Figure 37:
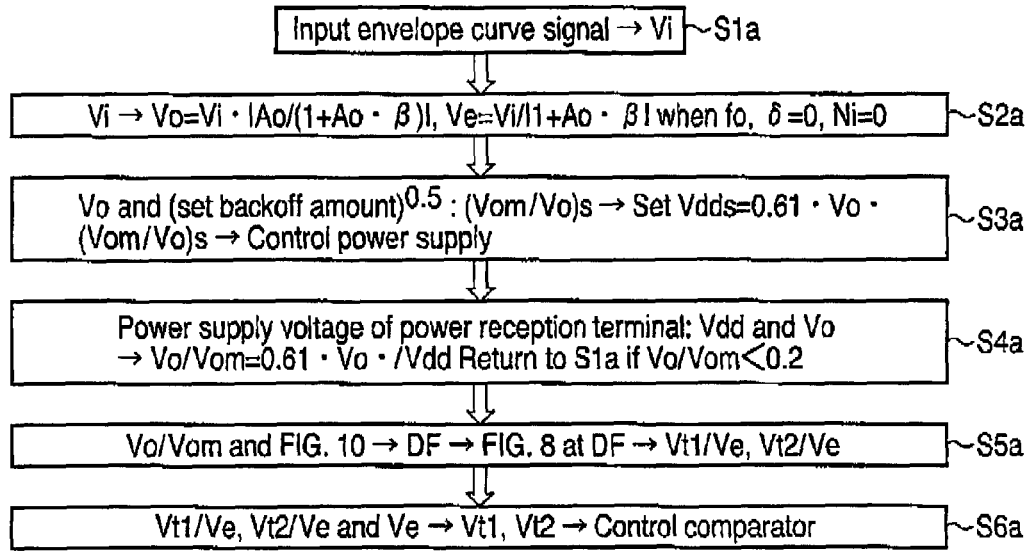
FIG. 37 illustrates an example (Vt1≠Vt2, τ=0) of a control method according to the second embodiment.

By combining the embodiments described above, various controls can be embodied. The basic procedure for processing is shown in FIG. 37. In the example of FIG. 37, where Vt1≠Vt2 and τ=0, the circuit that is not required in FIG. 15 may be deleted.

First, the control module 128 varies the power voltage so that the relation Vo/Vom<0.2, which has a high gain and unstable negative feedback, is not satisfied. In step S1a, Vi (Vpeak) is obtained from the envelope curve signal, and Vo=Vi·|Ao/(1+Ao·β)|(Vpeak) and Ve=Vi/|1+Ao·β|(Vpeak) are obtained in step S2a when δ=0 and Ni=0 at fo. It is to be noted that Ao and β are stored in a table in advance. In step S1a, Vdds=0.61·Vo·(Vom/Vo)s of the power voltage to be set is obtained from (Vom/Vo)s and Vo of 0.5 (set backoff amount), and the power supply 116 is controlled. In step S4a, the actual value, Vo/Vom=0.61·Vo/Vdd is obtained from Vdd and Vo of the power supply voltage of the power reception terminal of the switching amplifier 109 in step S4a, and when Vo/Vom<0.2, the procedure returns to step S1a. When Vo/Vom≧0.2 on the other hand, DF is obtained from FIG. 10 based on Vo/Vom in step S5a, and Vt1/Ve and Vt2/Ve are obtained at this DF from FIG. 8.

Further, in step S6a, Vt1 and Vt2 are obtained from Vt1/Ve and Vt2/Ve and the comparator 108 is controlled. This control method compensates for the amplitude distortion and phase distortion simultaneously, but needs to be switched to other control methods in a case where an error operation is caused when the backoff amount is large. When the method is switched, the initial value of another control method is obtained using Vo/Vom at that time. For example, when Vo/Vom>0.2 in step S4a of FIG. 37 and the error operation is caused, the operation is jumped to step S5b in order to switch to the procedure of FIG. 38 that will be described below.

Figure 38:
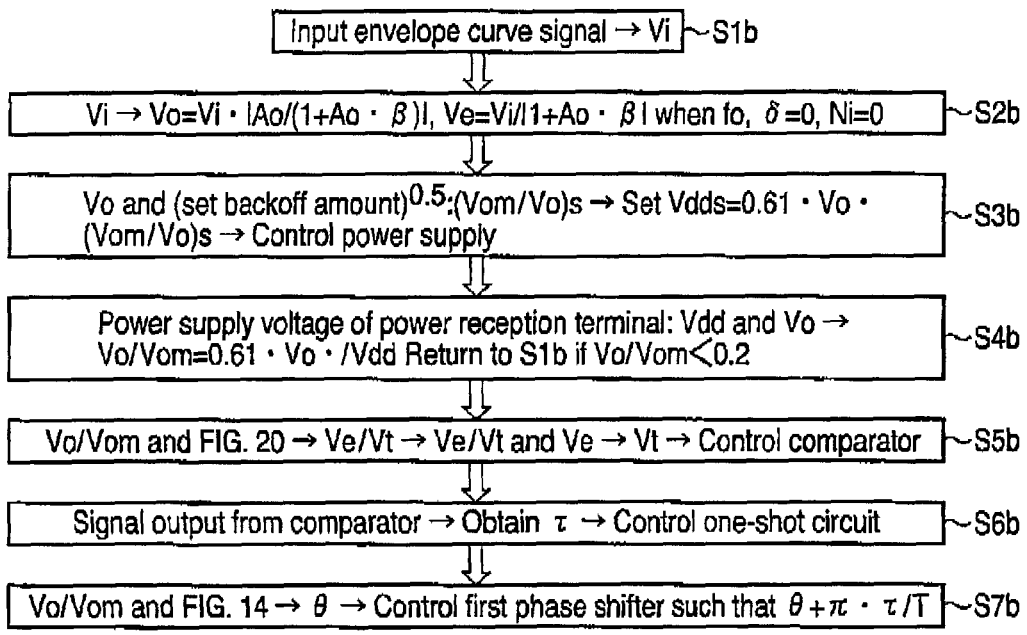
FIG. 38 illustrates another example (Vt1=Vt2=Vt, τ≠0) of a control method according to the second embodiment.

FIG. 38 is a flowchart illustrating an example of processing of the control module 128 when Vt1=Vt2=Vt and τ≠0. In FIG. 38, since step S1b to step S4b are the same as step S1a to step S4a of FIG. 37, the description will be omitted. In step S5b, Ve/Vt is obtained from Vo/Vom and FIG. 20, and Vt is obtained from Ve/Vt so as to control the comparator 108. In step S6b, τ is obtained from the signal output from the comparator 108 and the one-shot circuit 129 is controlled, and in step S7b, θ is obtained from FIG. 14 based on Vo/Vom, and the first phase control circuit 132 is controlled such that θ+π·τ/T.

Figure 39:
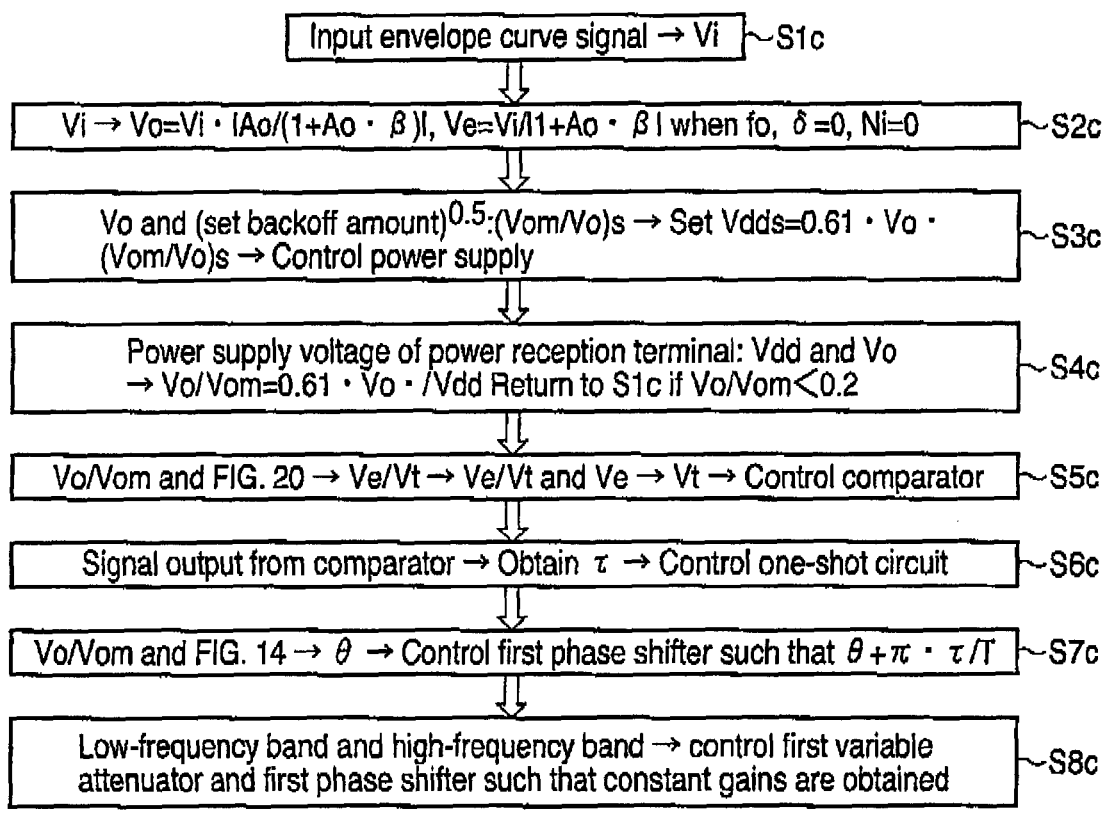
FIG. 39 illustrates another example (Vt1=Vt2=Vt, τ≠0) of a control method according to the second embodiment.

FIG. 39 is a flowchart illustrating another example of processing of the control module 128, when Vt1=Vt2=Vt and τ≠0. In FIG. 39, step S1b to step S7b are the same as steps S1b to step S7b of FIG. 38, and detailed description of such steps will be omitted. In step S8C, the control module 128 controls the first variable attenuator 133 and the first phase control circuit 132, such that the low-frequency gain and the high-frequency gain become constant.

The negative feedback becomes more stable when the response rates of steps S1a to step S6a of FIG. 37, steps S1b to S7b of FIG. 38, and steps S1c to S7c of FIG. 39 are higher. Distortion caused by the delay in control or error is compensated by a negative feedback.

With respect to FIGS. 37 to 39, the power supply voltage has been described as being varied such that the relation Vo/Vom<0.2 is not satisfied. However, in order to make the power supply voltage compliant even when the envelope curve signal decreases and falls below zero, a quick-response power supply is required. The power supply efficient of such a power supply is low. When a high-efficient power supply with a response rate that falls within the range of backoff amount set when the input envelope curve is large is used, on the other hand, the actual power supply voltage when the envelope curve signal decreases and falls below zero is high, and Vo/Vom is smaller than 0.2. Although the negative feedback is stable when Vo/Vom<0.2, by returning to step S1c when Vo/Vom<0.2 in step S4C of FIG. 39, the control for stabilizing the negative feedback can be held. Accordingly, the state becomes unstable between the state of Vo/Vom=0.2 and the state in which the comparator 108 is not turned on, and the average Vo/Vom becomes smaller than 0.2. When Vo/Vom>0.2, the relation Vt<Ve=Vi/|1+Ao·β| is satisfied, but the comparator 108 may be turned on and be compliant while Vi is greater than the held Vt, even when Vi decreases. When Vi<Vt, the state in which the comparator is not turned on continues, and Vo becomes zero. Accordingly, by increasing the distortion improvement amount |1+Ao·β|, it is possible to be compliant with a small signal and obtain a large dynamic range.

Further, when the procedure returns to step S1c, for example, θ is obtained from FIG. 14 based on Vo/Vom, and the first phase control circuit 132 is controlled. Thereby, the instable domain is avoided, the output signal decreases, and the feedback signal also decreases after the state in which the comparator 108 is not turned on continues for a while. By controlling the comparator 108 by obtaining Vt from Ve/Vt and Ve by setting Ve/Vt=0.95 as a constant value, such that Ve/Vt>1 is temporarily satisfied when the error signal that subtracts a feedback signal from the input signal increases, the instable domain is avoided, and the distortion improvement amount can be prevented from lowering even in a small signal. Further, digital predistortion (DPD) may be combined with such control methods.

As described above, since the open loop gain becomes zero when the comparator 108 continues to be turned off, even in the domain of Vo/Vom<0.2, in which the negative feedback is unstable, the negative feedback is applied on average and distortion can be compensated. In this state, since complete synchronization with the resonance phenomenon of the output-side tuning circuit 117 of the switching amplifier 109 is not established, out-of-band noise is generated. However, this only means that the envelop curve signal decreases and falls below zero. Compared to Patent Document 2, the synchronization with the resonance phenomenon of the output-side tuning circuit 117 is greatly improved, decline in efficiency is small even at high frequencies, and out-of-band noise can be greatly reduced. Accordingly, the specification of a bandpass filter for preventing out-of-band noise components on a bulk-power output side can be greatly reduced or eliminated.

The present embodiment is not limited to the above-described embodiments. In each of the embodiments, as described in the specified model of distortion of the class E operation with reference to FIG. 6, the control module 128 needs to input, store, or learn information necessary for control, such as distortion of the actual switching amplifier 109.

Further, the control method shown in FIGS. 37 to 39 are merely an example, and when the fluctuation factors, such as the high-frequency input frequency and the temperature of the switching amplifier 109 cannot be ignored, control based on such factors may be added. Further, when the power supply voltage dependency of Cds cannot be ignored, for example, FIG. 8 may be separately provided for each Vdd, as well as DF.

Figure 40A:
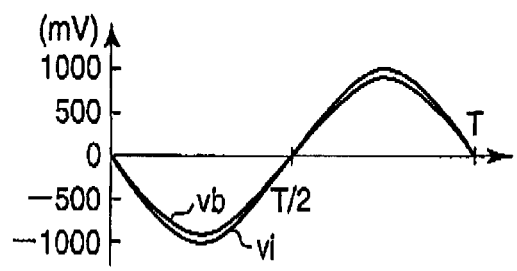
FIGS. 40A and 40B illustrate other examples of waveforms of signals in the above-described embodiments.
Figure 40B:
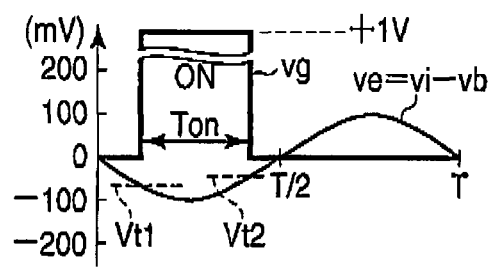

When the waveforms of signals are in a phase relation as shown in FIGS. 40A and 40B, the threshold voltage of the comparator 108 is turned on from off when the input voltage crosses from high to low as a first threshold voltage in an off-state, and is turned off from on when the input voltage crosses from low to high as a second threshold voltage in an on-state.

Further, a reverse phase can be obtained by replacing on with off and off with on and replacing the OR gate 130 with an AND gate, but a negative feedback is obtained by varying the phase by 180 degrees in the first phase control circuit 132.

Moreover, while the class E amplifier has been described as being used as the switching amplifier 109, a class F amplifier, which causes the voltage to approximate a square wave by short-circuiting the output-side tuning circuit at even-numbered frequencies and making the output-side tuning circuit open at odd-numbered frequencies so as to attain high efficiency, or a reverse class F amplifier, which causes the voltage to approximate a square wave by short-circuiting the output-side tuning circuit at odd-numbered frequencies and making the output-side tuning circuit open at even-numbered frequencies so as to attain high efficiency output tuning circuit can be similarly used.

Figure 41A:
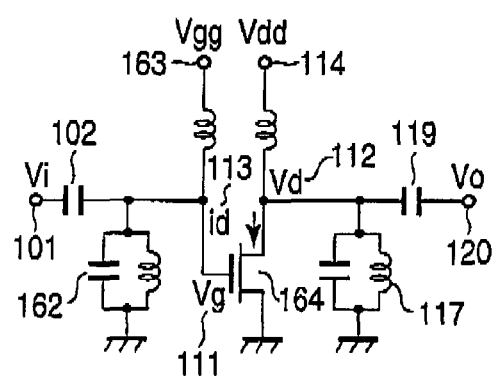
FIGS. 41A and 41B illustrate examples of class A and class B amplifiers.
Figure 41B:
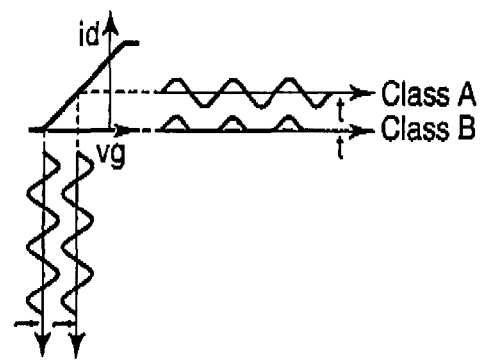

Further, class A, class AB, class B amplifiers, which are broader in bands than class E, class F, and reverse F amplifiers, can be similarly used by adding the following modifications, although they are not switching amplifiers. FIG. 41A shows an example of equivalent circuits of class A, class AB, class B amplifiers, and an output tuning circuit 117 resonates to a fundamental wave, and a load impedance of an amplification element 164 with respect to high-frequency waves is short-circuited. Further, an input-side tuning circuit 162 resonates to the fundamental wave. In FIG. 41B indicating the gate voltage vg-drain current id characteristics of the amplification element 164, by making the power supply voltage (Vgg) 163 of the gate side half the cutoff voltage, at which id=0 in the class A amplifier, the drain current flows at all the frequencies. Thereby, the theoretical efficiency at the time of maximum output when the input is not excessive becomes 50%. In the class B amplifier, by making (Vgg) 163 a pinch off voltage, the drain current flows only in half the frequency, and theoretical efficiency at the maximum output when the input is not excessive is 79%. The class AB is an intermediate class between class A and class B. Since the input side tuning circuit 162 short-circuits high-frequency waves even by inputting the pulse signal to the high-frequency input terminal 101 of FIG. 41A, the gate voltage (vg) 111 is formed only of fundamental waves. Accordingly, unless an excessive input is made, a switching operation, in which the period of time other than a saturated state of a cutoff state is short, is not performed. When an excessive input is made, on the other hand, excessive gate current flows and the problem of reliability is caused.

Accordingly, by removing the input side tuning circuit 162 and connecting an output terminal of the pulse amplifier 143 of FIG. 29 to an input terminal of the amplification element 164, and setting the output voltage of the pulse amplifier 143 such that the saturated state is obtained in an on-state and a cutoff state is obtained in an off-state, a broadband high-efficiency power amplifier is obtained.

Further, the switching element 110 is not limited to a GaN HEMT and may be applied to other amplification elements, such as a bipolar transistor using Si, SiGe, GaAs, GaP, SiC, and the like, a hetero-junction bipolar transistor (HBT), a metal-oxide-semiconductor field-effect transistor (MOS FET), a lateral doped metal-oxide-semiconductor field effect transistor (LDMOS), a metal insulator semiconductor field effect transistor (MIS FET), a metal-semiconductor field effect transistor (MES FET), and heterojunction field effect transistor (HFET).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power amplification device configured to switching-amplify a high-frequency input signal and output a switching-amplified signal, comprising:
    a feedback circuit configured to output a feedback signal including a portion of the switching-amplified signal;
    a subtractor configured to output an error signal indicating a difference between the input signal and the feedback signal;
    a comparator configured to compare the error signal with a threshold voltage and generate an on/off pulse signal for switching-amplifying the input signal based on a result of the comparison;
    a one-shot circuit connected directly or indirectly to a port for an output of the comparator and configured to be set in an on-state for a time period using a rising timing of the pulse signal as a trigger; and
    an amplifier configured to switching-amplify the input signal by a logical OR between the generated on/off pulse signal and an output signal from the one-shot circuit, and output the switching-amplified signal, wherein the amplifier is set in a saturated state if a signal voltage for the pulse signal is in an on-state, and is set in a cutoff state if the signal voltage is in an off-state.

2. The device according to claim 1, further comprising a control module configured to control the time period during which the one-shot circuit is turned on based on an operation with respect to input information indicating at least one of the pulse signal, a power supply voltage for a power reception terminal in the amplifier, an envelope curve signal of the input signal, a frequency for the input signal, or a temperature in the amplifier.

3. A power amplification device configured to switching-amplify a high-frequency input signal and output a switching-amplified signal, comprising:
    a feedback circuit configured to output a feedback signal including a portion of the switching-amplified signal;
    a subtractor configured to output an error signal indicating a difference between the input signal and the feedback signal;
    a comparator configured to compare the error signal with a threshold voltage and generate an on/off pulse signal for switching-amplifying the input signal based on a result of the comparison;
    an amplifier configured to switching-amplify the input signal based on the generated on/off pulse signal and output the switching-amplified signal, wherein the amplifier is set in a saturated state if a signal voltage for the pulse signal is in an on-state, and is set in a cutoff state if the signal voltage is in an off-state;
    a gain control circuit configured to control a gain for the error signal;
    a phase control circuit configured to control a phase for the error signal;
    a first bandpass filter configured to pass high-frequency components in the input signal which are higher than a frequency center in the input signal;
    a second bandpass filter configured to pass low-frequency components in the input signal which are lower than the frequency center in the input signal;
    a third bandpass filter configured to pass high-frequency components in the error signal which are higher than a frequency center in the error signal;
    a fourth bandpass filter configured to pass low-frequency components in the error signal which are lower than the frequency center in the error signal;
    a power detector configured to detect an output power of each of the first to fourth bandpass filters; and
    a control module configured to obtain a gain of a power ratio for the error signal to the input signal in a high-frequency band and a low-frequency band, control the phase control circuit such that the gain of the high-frequency band and the gain of the low-frequency band become equal by decreasing the phase when the gain of the high-frequency band is higher than the gain of the low-frequency band and by increasing the phase when the gain of the high-frequency band is lower than the gain of the low-frequency band, and control the gain control circuit such that the gain of the high-frequency band and the gain of the low-frequency band become reference gains.

4. A power amplification device configured to switching-amplify a high-frequency input signal and output a switching-amplified signal, comprising:
    a feedback circuit configured to output a feedback signal including a portion of the switching-amplified signal;

a subtractor configured to output an error signal indicating a difference between the input signal and the feedback signal;

a comparator configured to compare the error signal with a threshold voltage and generate an on/off pulse signal for switching-amplifying the input signal based on a result of the comparison;

an amplifier configured to switching-amplify the input signal based on the generated on/off pulse signal and output the switching-amplified signal, wherein the amplifier is set in a saturated state if a signal voltage for the pulse signal is in an on-state, and is set in a cutoff state if the signal voltage is in an off-state;

an inverter configured to invert a polarity of the pulse signal;

an output switching device configured to switch between an output signal from the inverter and the pulse signal; and a control module configured to control the output switching device and vary the phase of the pulse signal by 180 degrees.

5. A power amplification device configured to switching-amplify a high-frequency input signal and output a switching-amplified signal, comprising:

a feedback circuit configured to output a feedback signal including a portion of the switching-amplified signal;

a subtractor configured to output an error signal indicating a difference between the input signal and the feedback signal;

a comparator configured to compare the error signal with a threshold voltage and generate an on/off pulse signal for switching-amplifying the input signal based on a result of the comparison;

an amplifier configured to switching-amplify the input signal based on the generated on/off pulse signal and output the switching-amplified signal, wherein the amplifier is set in a saturated state if a signal voltage for the pulse signal is in an on-state, and is set in a cutoff state if the signal voltage is in an off-state;

a signal processing module configured to output an envelope curve signal of the input signal; and a control module configured to control a power supply voltage supplied to the amplifier according to a level of the envelope curve signal, and cause the signal processing module to output the input signal after a delay time has elapsed.

6. The device according to claim 5, wherein the signal processing module converts the input signal into an intermediate frequency signal and reconverts the converted signal into an original high-frequency signal.

7. The device according to claim 5, wherein the input signal is an intermediate frequency signal and the signal processing module converts the frequency of the input signal.

8. The device according to claim 5, wherein the control module varies the delay time according to response characteristics of the power supply of the amplifier.

9. The device according to claim 5, wherein the signal processing module converts the input signal into an I/Q intermediate frequency signal, and reconverts the converted signal into an original high-frequency signal.

10. The device according to claim 5, wherein the signal processing module converts the input signal into an I/Q base band signal, and reconverts the converted signal into an original high-frequency signal.

11. The device according to claim 5, wherein the input signal is an I/Q intermediate frequency signal, and the signal processing module converts the frequency of the input signal.

12. The device according to claim 5, wherein the input signal is an I/Q base band signal, and the signal processing module converts the frequency of the input signal.

13. A power amplification device configured to switching-amplify a high-frequency input signal and output a switching-amplified signal, comprising:

a feedback circuit configured to output a feedback signal including a portion of the switching-amplified signal;

a subtractor configured to output an error signal indicating a difference between the input signal and the feedback signal;

a comparator configured to compare the error signal with a threshold voltage and generate an on/off pulse signal for switching-amplifying the input signal based on a result of the comparison;

an amplifier configured to switching-amplify the input signal based on the generated on/off pulse signal and output the switching-amplified signal, wherein the amplifier is set in a saturated state if a signal voltage for the pulse signal is in an on-state, and is set in a cutoff state if the signal voltage is in an off-state;

a gain control circuit configured to control a gain for the error signal;

a phase control circuit configured to control a phase for the error signal;

a first bandpass filter configured to pass high-frequency components in the input signal which are higher than a frequency center in the input signal;

a second bandpass filter configured to pass low-frequency components in the input signal which are lower than the frequency center in the input signal;

a third bandpass filter configured to pass high-frequency components in the switching-amplified signal which are higher than a frequency center in the switching-amplified signal;

a fourth bandpass filter configured to pass low-frequency components in the switching-amplified signal which are lower than the frequency center in the switching-amplified signal;

a power detector configured to detect an output power of each of the first to fourth bandpass filters; and a control module configured to obtain a gain of a power ratio for the switching-amplified signal to the input signal in a high-frequency band and a low-frequency band, control the phase control circuit such that the gain of the high-frequency band and the gain of the low-frequency band become equal by decreasing the phase when the gain of the high-frequency band is higher than the gain of the low-frequency band and by increasing the phase when the gain of the high-frequency band is lower than the gain of the low-frequency band, and control the gain control circuit such that the gain of the high-frequency band and the gain of the low-frequency band become reference gains.

* * * * *